United States Patent
Oyu

(10) Patent No.: US 7,670,911 B2
(45) Date of Patent: Mar. 2, 2010

(54) METHOD FOR MANUFACTURING VERTICAL MOS TRANSISTOR

(75) Inventor: Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 20 days.

(21) Appl. No.: 12/183,093

(22) Filed: Jul. 31, 2008

(65) Prior Publication Data

US 2009/0042347 A1  Feb. 12, 2009

(30) Foreign Application Priority Data

Aug. 9, 2007  (JP)  ............... 2007-208194

(51) Int. Cl.
*H01L 21/336* (2006.01)
(52) U.S. Cl. ............... 438/271; 438/238; 257/E27.056; 257/E27.057; 257/E27.096; 257/E29.183; 257/E29.189; 257/E29.262; 257/E29.274; 257/E29.313; 257/E29.318; 257/E21.375; 257/E21.41
(58) Field of Classification Search .............. 438/238, 438/271, FOR. 192; 257/E27.056, E27.057, 257/E27.096, E29.183, E29.189, E29.262, 257/E29.274, E29.313, E29.318, E21.375, 257/E21.41
See application file for complete search history.

(56) References Cited

U.S. PATENT DOCUMENTS

| 6,165,829 A * | 12/2000 | Gil ............................. 438/238 |
| 6,261,933 B1 * | 7/2001 | Hakey et al. ................. 438/588 |
| 6,818,937 B2 | 11/2004 | Noble et al. |
| 2003/0098478 A1 * | 5/2003 | Tobben et al. ............... 257/288 |
| 2004/0262681 A1 | 12/2004 | Masuoka et al. |
| 2007/0252192 A1 * | 11/2007 | Mokhlesi et al. ........... 257/315 |

* cited by examiner

*Primary Examiner*—Michelle Estrada
(74) *Attorney, Agent, or Firm*—Sughrue Mion, PLLC

(57) ABSTRACT

A method for manufacturing a vertical MOS transistor comprising forming a protrusion-like region, forming a silicon oxide film on an exposed surface of the protrusion-like region and a surface of the silicon semiconductor substrate, increasing a film thickness of at least the silicon oxide film on the silicon semiconductor substrate by thermal oxidation to form a first insulating film, forming a lower impurity diffusion region, removing the silicon oxide film to expose a silicon side of the protrusion-like region, thermally oxidizing the silicon side to form a second insulating film having a thinner film thickness than a film thickness of the first insulating film, forming a gate electrode over a side of the protrusion-like region, and forming an upper impurity diffusion region.

15 Claims, 23 Drawing Sheets

US 7,670,911 B2

METHOD FOR MANUFACTURING VERTICAL MOS TRANSISTOR

This application is based upon and claims the benefit of priority from Japanese Patent Application No. 2007-208194, filed on Aug. 9, 2007, the disclosure of which is incorporated herein in its entirety by reference.

BACKGROUND OF THE INVENTION

1. Field of the Invention

The present invention relates to a method for manufacturing a vertical MOS transistor.

2. Description of the Related Art

With the miniaturization of semiconductor devices in recent years, the current driving ability of a MOS transistor making up a semiconductor device tends to decrease. In order to improve this current driving ability, a vertical MOS transistor of a three-dimensional structure in which the source region, the channel region, and the drain region are vertically located is proposed. This vertical MOS transistor has the advantage that a significant improvement in current driving ability can be achieved by completely depleting the channel region.

A related vertical MOS transistor comprises a Si pillar that forms source/drain regions and a channel region, as shown in FIG. 2 of U.S. Patent Application Publication No. 2004/262681, and this channel region is surrounded by a gate insulating film and a gate electrode.

Also, this vertical MOS transistor is used in various areas, making use of its advantage. As an example of its use, an example in which a vertical MOS transistor is used as the memory cell transistor of a DRAM is proposed in FIG. 8 of U.S. Pat. No. 6,818,937. In this structure, a capacitor is provided on an impurity diffusion layer on a channel region making up a three-dimensional transistor, and a bit line is located under an impurity diffusion layer under the channel region. Also, the channel region is surrounded by a gate electrode (a word line) via a gate insulating film.

A vertical MOS transistor as described in U.S. Patent Application Publication No. 2004/262681 has the advantage that the current driving ability can be improved, but has the problem that the junction leak increases due to GIDL (Gate Induced Drain Leakage).

Also, when a DRAM cell transistor is formed using a vertical MOS transistor, and for example, with the source/drain regions being of N-type and the channel region being of P-type, a capacitor is formed under the lower N-type impurity diffusion layer, the junction leak increases in the depletion layer of the junction portion formed by the N-type impurity diffusion layer and p-type Si due to GIDL. Also, a DRAM cell transistor in U.S. Pat. No. 6,818,937 has the problem that the junction leak increases in the depletion layer of the junction portion formed by the impurity diffusion layer and the channel region due to GIDL.

In other words, the present inventor has discovered that when vertical MOS transistors are used, problems occur in any case, for example, the charge stored in the capacitor leaks due to junction leak current due to GIDL.

SUMMARY OF THE INVENTION

In one embodiment, there is provided a method for manufacturing a vertical MOS transistor comprising:

providing a mask pattern on a silicon semiconductor substrate;

patterning the silicon semiconductor substrate using the mask pattern as a mask to provide a protrusion-like region protruding upward from a predetermined plane of the silicon semiconductor substrate;

forming a silicon oxide film and a silicon nitride film in sequence on an exposed surface of the protrusion-like region and a surface of the silicon semiconductor substrate;

increasing a film thickness of at least the silicon oxide film on the silicon semiconductor substrate by thermal oxidation to form a first insulating film;

implanting an impurity into the silicon semiconductor substrate using the mask pattern as the mask and then thermally treating to form a lower impurity diffusion region;

removing the silicon oxide film except the first insulating film and the silicon nitride film to expose a silicon side of the protrusion-like region;

thermally oxidizing the exposed silicon side of the protrusion-like region to form a second insulating film having a thinner film thickness than a film thickness of the first insulating film;

forming a gate electrode over a side of the protrusion-like region;

removing the mask pattern; and implanting an impurity into an upper portion of the protrusion-like region and then thermally treating to form an upper impurity diffusion region.

In the other one embodiment, there is provided a method for manufacturing a vertical MOS transistor comprising:

forming a protrusion-like region protruding upward from a predetermined plane of a silicon semiconductor substrate;

forming a silicon oxide film on an exposed surface of the protrusion-like region and a surface of the silicon semiconductor substrate;

increasing a film thickness of at least the silicon oxide film on the silicon semiconductor substrate by thermal oxidation to form a first insulating film;

forming a lower impurity diffusion region extending from a lower portion of the protrusion-like region to an inside of the silicon semiconductor substrate;

removing the silicon oxide film except the first insulating film to expose a silicon side of the protrusion-like region;

thermally oxidizing the exposed silicon side of the protrusion-like region to form a second insulating film having a thinner film thickness than a film thickness of the first insulating film;

forming a gate electrode over a side of the protrusion-like region; and;

forming an upper impurity diffusion region in an upper portion of the protrusion-like region.

In the other one embodiment, there is provided a method for manufacturing a vertical MOS transistor comprising:

forming a protrusion-like region protruding upward from a predetermined plane of a silicon semiconductor substrate;

forming a silicon oxide film on an exposed surface of the protrusion-like region and a surface of the silicon semiconductor substrate;

increasing a film thickness of at least the silicon oxide film on the silicon semiconductor substrate by thermal oxidation to form a first insulating film;

forming a lower impurity diffusion region extending from a lower portion of the protrusion-like region to an inside of the silicon semiconductor substrate;

removing the silicon oxide film except the first insulating film to expose a silicon side of the protrusion-like region;

thermally oxidizing the exposed silicon side of the protrusion-like region to form a second insulating film having a thinner film thickness than a film thickness of the first insulating film;

forming a gate electrode over a side of the protrusion-like region;

removing the second insulating film on an upper portion side of the protrusion-like region so that the second insulating film remains on a side of a portion of the protrusion-like region except an upper portion;

forming a third insulating film having a thicker film thickness than a film thickness of the second insulating film or an insulating region having a thicker effective film thickness than a film thickness of the second insulating film between the upper portion side of the protrusion-like region and an upper portion side of the gate electrode opposed to the upper portion side of the protrusion-like region; and forming an upper impurity diffusion region in an upper portion of the protrusion-like region.

BRIEF DESCRIPTION OF THE DRAWINGS

The above features and advantages of the present invention will be more apparent from the following description of certain preferred embodiments taken in conjunction with the accompanying drawings, in which.

Figure 1:
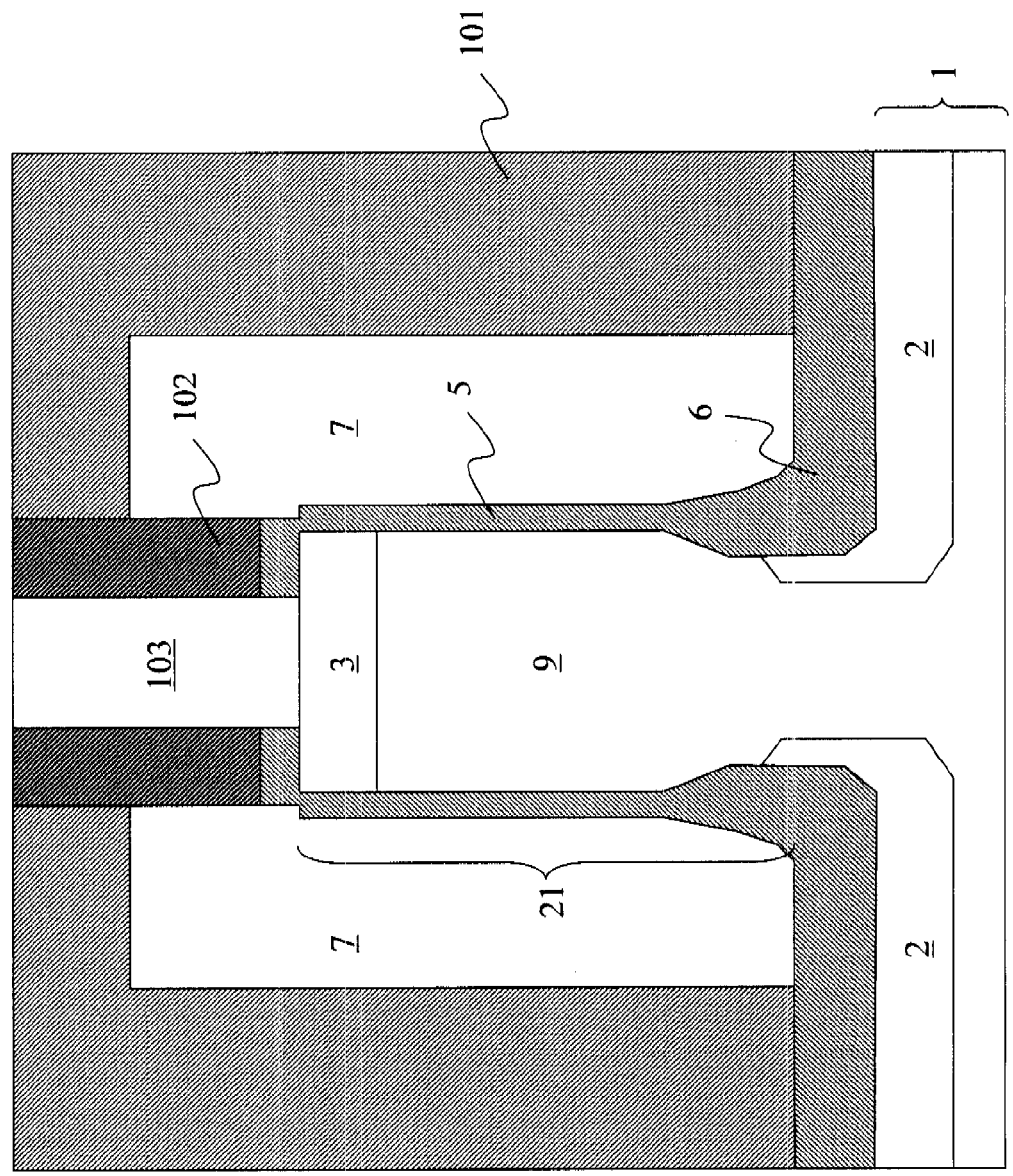
FIG. 1 is a cross-sectional view showing the vertical MOS transistor of Example 1.

In the drawings, numerals have the following meanings. 1: semiconductor substrate, 2: lower impurity diffusion region, 3: upper impurity diffusion region, 4: channel region, 5: gate insulating film, 7: gate electrode, 8: mask pattern, 9: protrusion-like region, 10: silicon oxide film, 11: silicon nitride film, 12: insulating film B, 13: silicon oxide film, 14: oxide film, 15: air gap region, 16: silicon oxide film, 17: silicon oxide film, 22: silicon oxide film, 25: oxide film 1, 26: insulating film A, 101: interlayer a first insulating film03: embedded electrode

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A First Embodiment

A vertical MOS transistor of the first embodiment comprising:

a first insulating film between a lower impurity diffusion region in semiconductor substrate and a gate electrode; and a gate insulating film between a protrusion-like region and a gate electrode, wherein the film thickness of the first insulating film is thicker than the film thickness of a gate insulating film.

One example of this vertical MOS transistor is shown in FIG. 1. As shown in FIG. 1, protrusion-like region 21 is provided on P-type Si semiconductor substrate 1. Lower impurity diffusion region 2 is provided in a region from a lower portion in this protrusion-like region 21 into semiconductor substrate 1, and upper impurity diffusion region 3 is provided in an upper portion in protrusion-like region 21. Also, a channel region is formed between upper impurity diffusion region 3 and lower impurity diffusion region 2 in the protrusion-like region.

This lower impurity diffusion region 2 is provided extending from the lower portion in protrusion-like region 21 into semiconductor substrate 1, as shown in FIG. 1. Lower impurity diffusion region 2 may occupy a part of the lower region of the protrusion-like region or may occupy all of the lower region, as long as it is present in at least a part of the lower region in protrusion-like region 21.

Gate electrode 7 is provided on this lower impurity diffusion region 2 in semiconductor substrate 1 and on the side of protrusion-like region 21. Also, insulating films 5 and 6 are provided between lower impurity diffusion region 2 in semiconductor substrate 1 and gate electrode 7 and between the side of protrusion-like region 21 and gate electrode 7. Among these insulating films, the portion between gate electrode 7 and the side of the channel region makes up gate insulating film 5, and the portion between gate electrode 7 and lower impurity diffusion region 2 makes up a first insulating film (numeral 6 in FIG. 1). The film thickness of a first insulating film (numeral 6 in FIG. 1) is thicker than the film thickness of gate insulating film 5.

When the film thickness of a first insulating film and the gate insulating film is not constant and varies, it is defined that "the film thickness of a first insulating film is thicker than the film thickness of the gate insulating film" when the film thickness of at least part of a first insulating film is thicker than the maximum film thickness of the gate insulating film in the vertical MOS transistor of this exemplary embodiment. The film thickness of part of a first insulating film may be the same as the maximum film thickness of the gate insulating film.

By the film thickness of a first insulating film (numeral 6 in FIG. 1) being thicker than the film thickness of gate insulating film 5 in this manner, the distance between lower impurity diffusion region 2 and gate electrode 7 can be long, so that the occurrence of junction leak current due to GIDL can be prevented.

One example of manufacturing method of the first embodiment will be described below with reference to the drawings.

First, P-type silicon semiconductor substrate 1 is prepared, and then, a surface of P-type silicon semiconductor substrate 1 is thermally oxidized to form silicon oxide film 31. Then, silicon nitride film 8 is formed on silicon oxide film 31, and then, silicon nitride film 8 and silicon oxide film 31 are patterned by a usual photolithography technique and dry etching technique to form a mask pattern.

Figure 2:
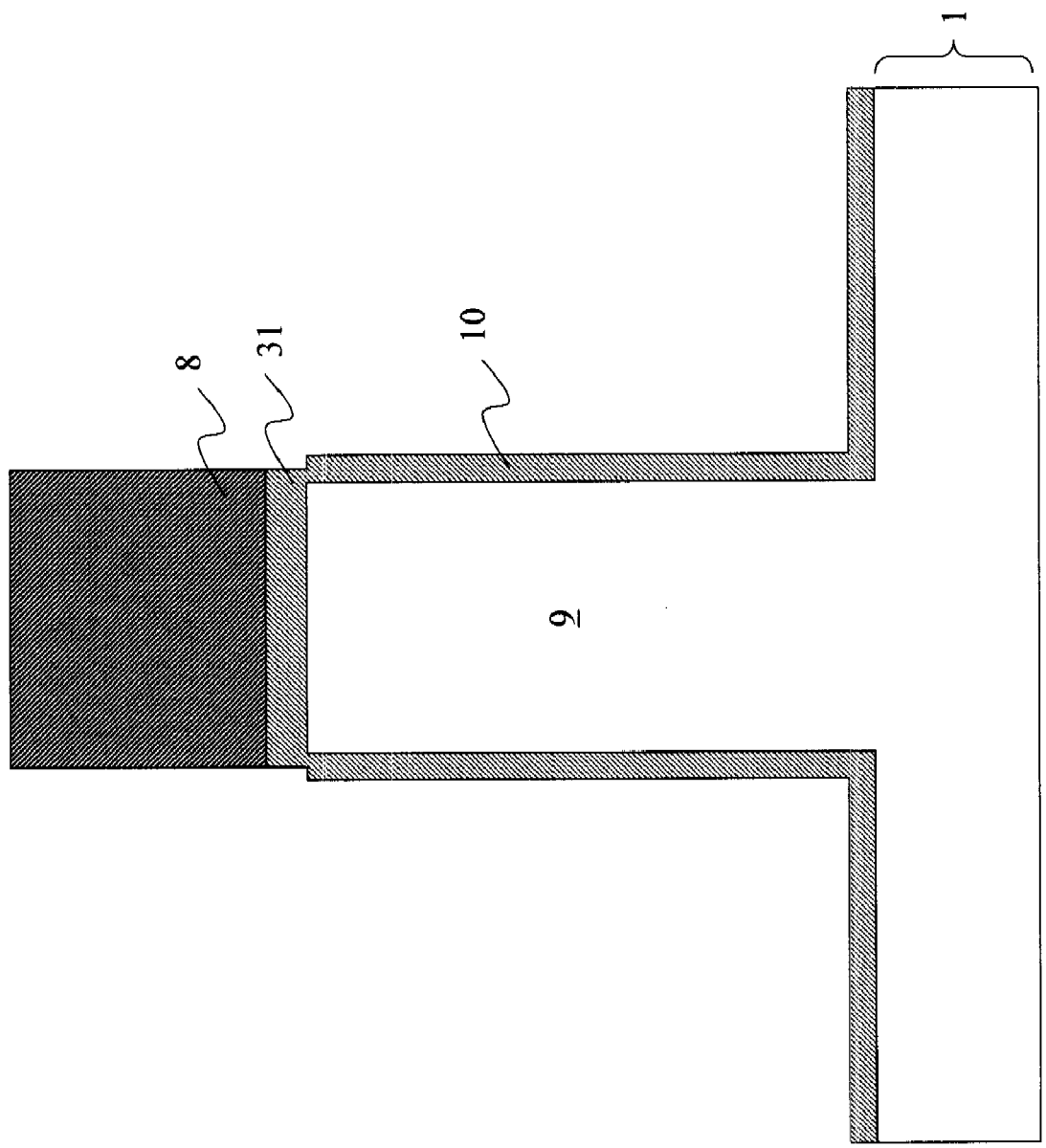
FIG. 2 is a cross-sectional view showing one step of a method for manufacturing a vertical MOS transistor according to Example 1.

Next, silicon substrate 1 is processed using the mask pattern as a mask to provide protrusion-like region 9 protruding upward from a predetermined plane of semiconductor substrate 1. Next, thermal oxidation is performed to form silicon oxide film 10 for protection on the surface of protrusion-like region 9 and P-type silicon semiconductor substrate 1 (FIG. 2).

Figure 3:
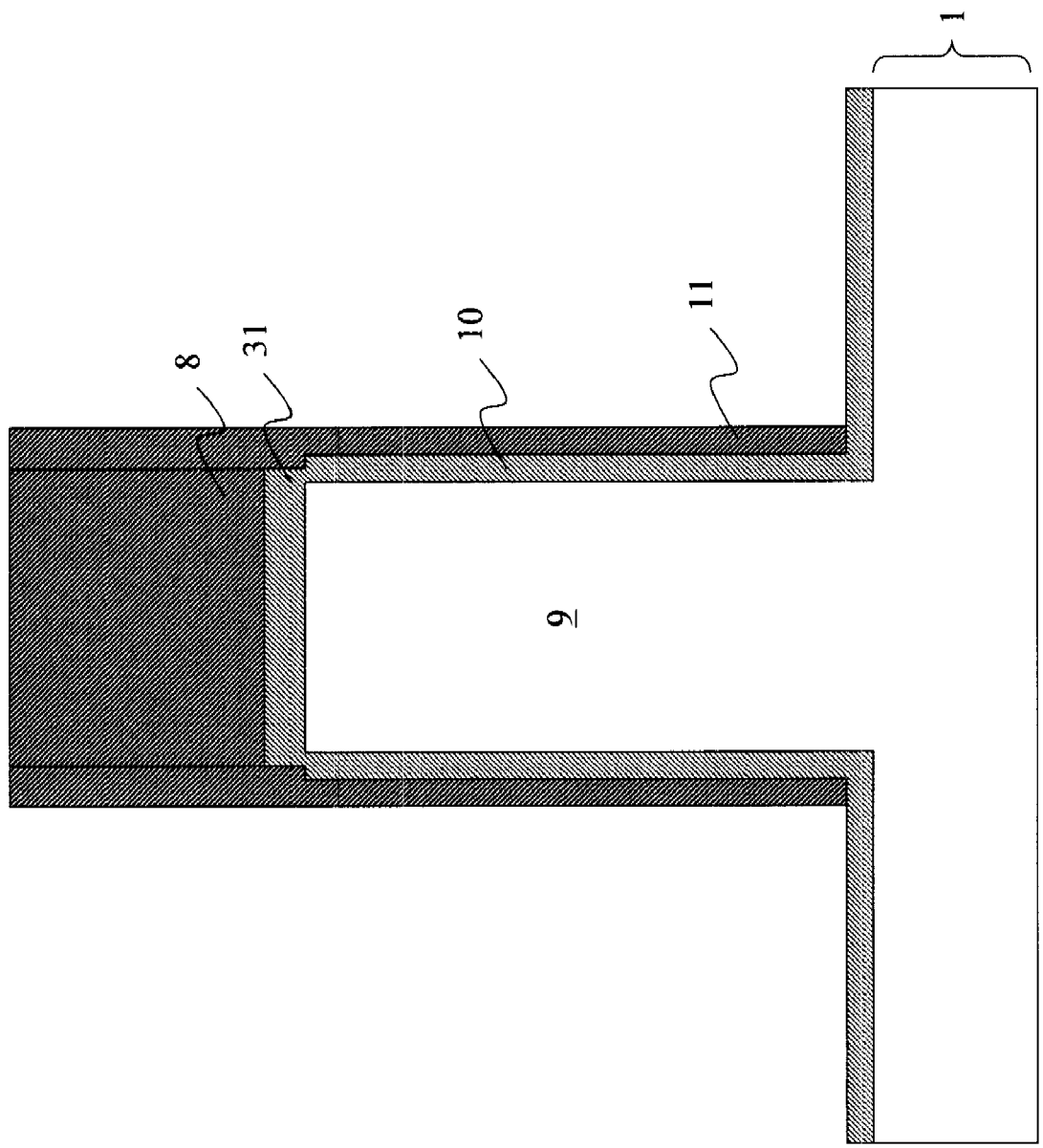
FIG. 3 is a cross-sectional view showing one step of the method for manufacturing a vertical MOS transistor according to Example 1.
Figure 4:
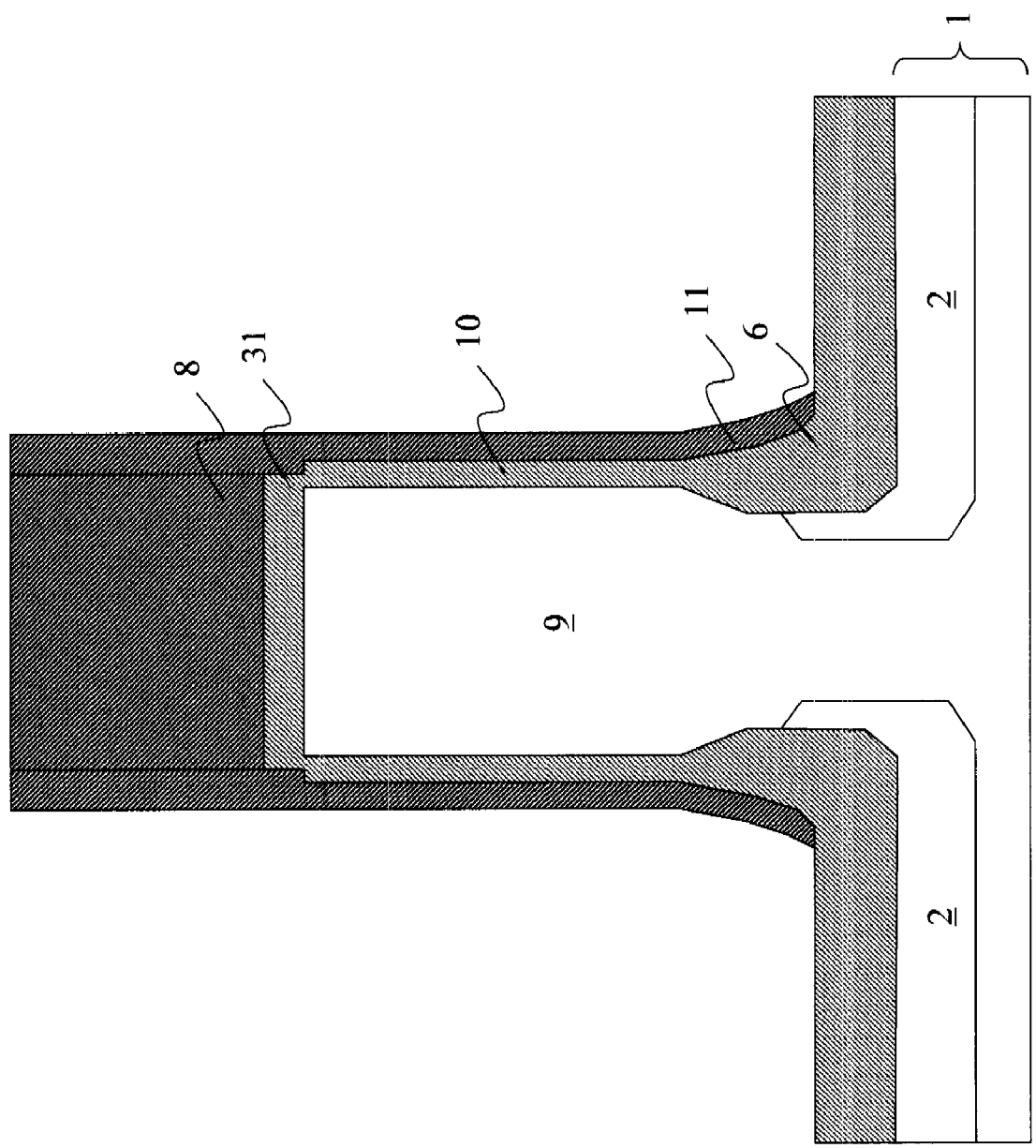
FIG. 4 is a cross-sectional view showing one step of the method for manufacturing a vertical MOS transistor according to Example 1.

Further, a spacer of silicon nitride film 11 is formed on the silicon oxide film side formed on protrusion-like region 9 (FIG. 3). Then, thermal oxidation is performed in this state. At this time, as shown in FIG. 4, an oxidizing species intrudes from the lower portion of silicon nitride film 11 for a spacer, and the lower portion of protrusion-like region 9 and the portion of the semiconductor substrate except the part where the protrusion-like region is provided are thermally oxidized, so that bird's beak-like thick silicon oxide film (a first insulating film) 6 is formed (FIG. 4).

Here, as the conditions of thermal oxidation for forming the above thick silicon oxide film 6, the following conditions are preferably used.

A mask pattern comprising a $SiO_2$ film having a film thickness of 5 nm to 10 nm and a SiN film having a film thickness of 100 nm to 200 nm is provided.

A silicon oxide film 10 having a film thickness of 5 nm to 10 nm is formed.

Thermal oxidation is performed in a dry oxygen atmosphere at a temperature of 800° C. to 1000° C. to form a $SiO_2$ film having a film thickness of 30 to 50 nm as a first insulating film.

Thermal oxidation is preferably performed under the above conditions because when the temperature of thermal oxidation is less than 800° C., long oxidation time may be required, and when the temperature of thermal oxidation is more than 1000° C., the bird's beak is easily formed, so that the control of the bird's beak is difficult. Also, thermal oxidation is preferably performed under a dry oxygen atmosphere at 900° C. in order that the film thickness of silicon oxide film 6 is 40 nm.

Next, using the mask pattern as a mask, an impurity is ion implanted into the portion in P-type silicon substrate 1 except the part where protrusion-like region 9 is formed, and heat treatment is performed to form lower impurity diffusion region 2 in P-type silicon semiconductor substrate 1.

Next, silicon nitride film 11 and silicon oxide film 10 for protection except the portion of a first insulating film are removed to expose the silicon side of protrusion-like region 9. Then, the exposed silicon side of protrusion-like region 9 is thermally oxidized to form second insulating film 5 (numeral 5 in FIG.) on the side of protrusion-like region 9. A second insulating film 5 formed in this manner is a gate insulating film.

Figure 5:
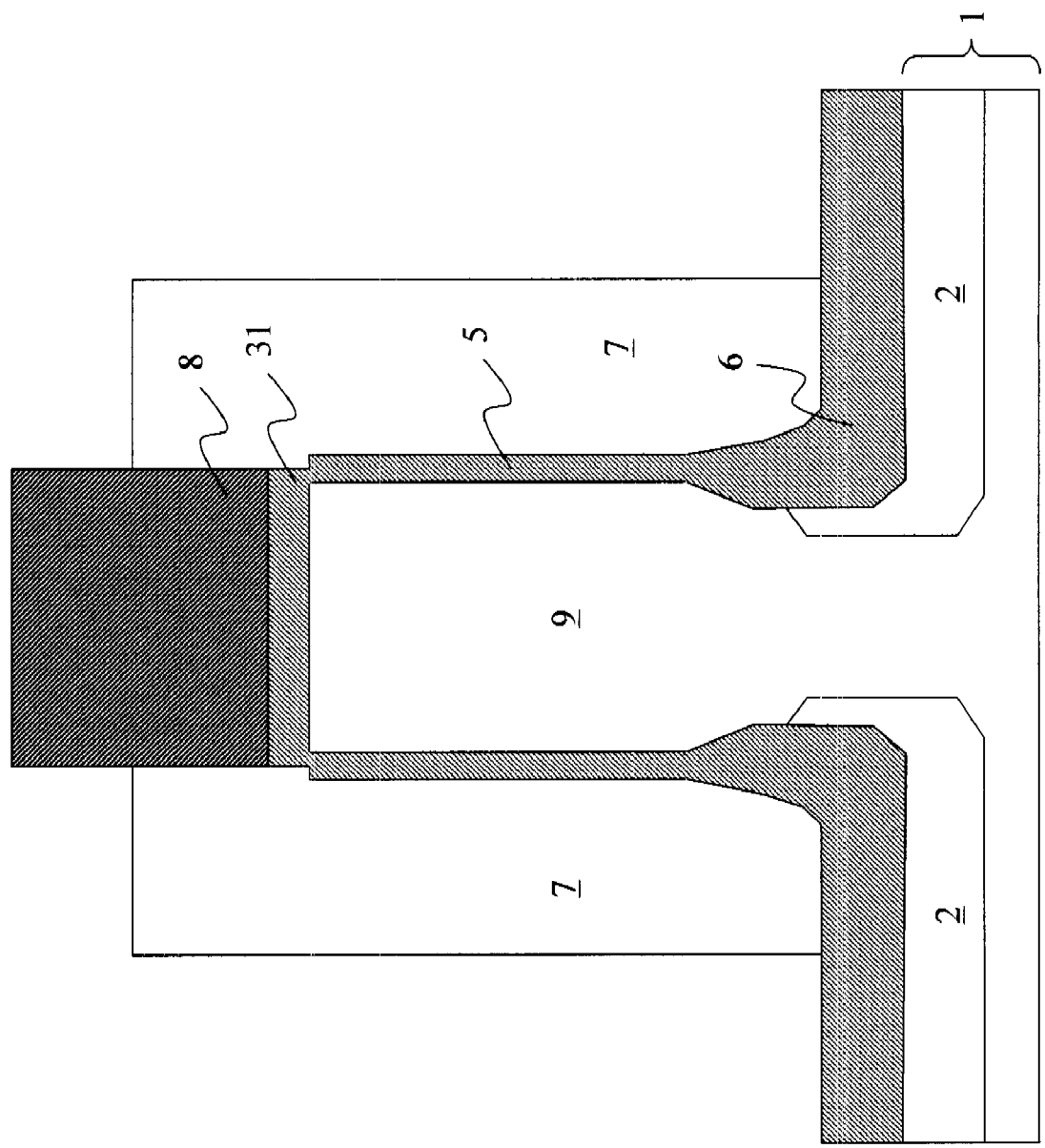
FIG. 5 is a cross-sectional view showing one step of the method for manufacturing a vertical MOS transistor according to Example 1.

Further, a polycrystalline silicon film into which an impurity is introduced is deposited, and then, etching back is performed to form gate electrode 7 on lower impurity diffusion region 2 in semiconductor substrate 1 and the side of protrusion-like region 9 (on a first insulating film and the gate insulating film) (FIG. 5).

Figure 6:
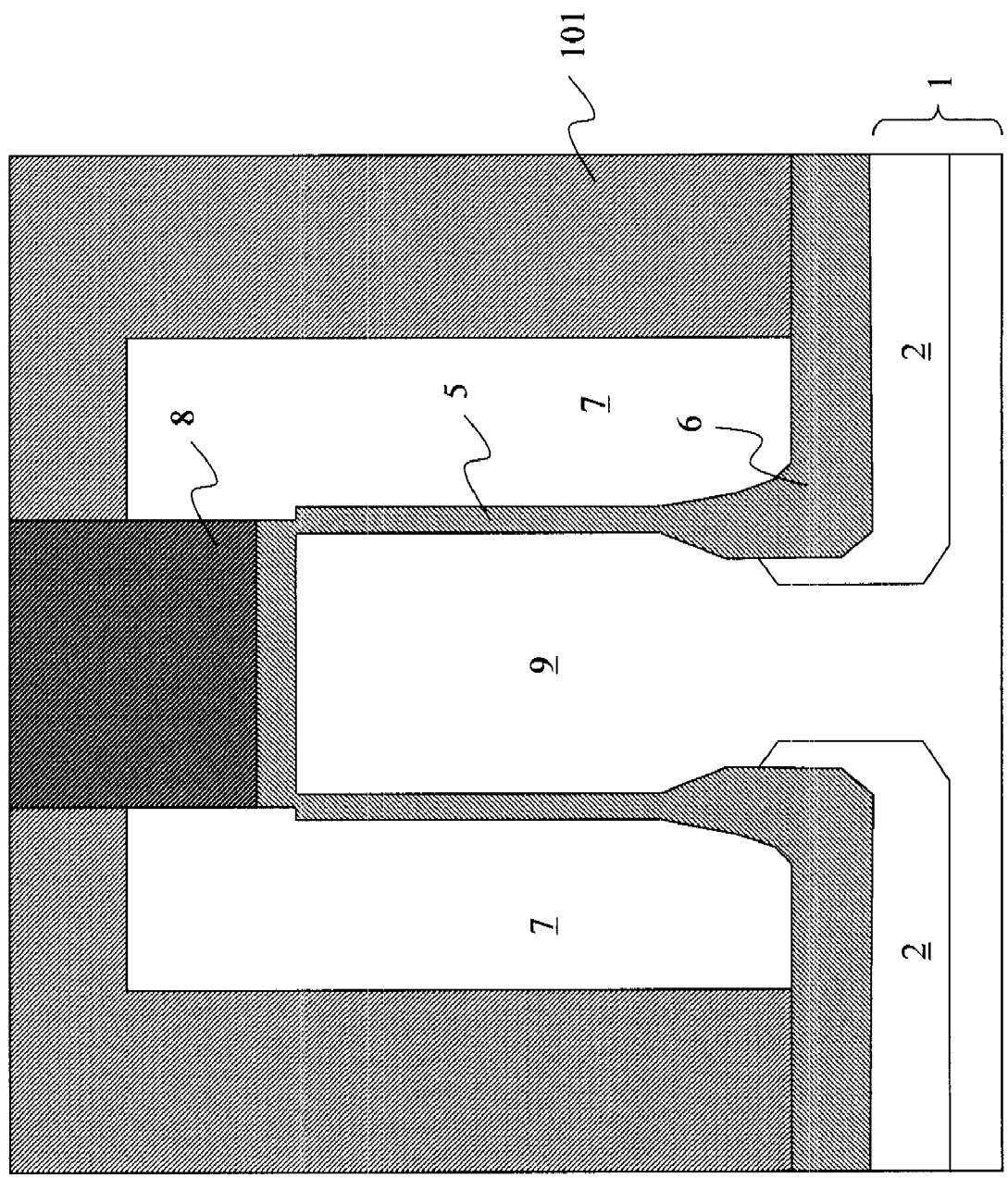
FIG. 6 is a cross-sectional view showing one step of the method for manufacturing a vertical MOS transistor according to Example 1.

Next, as shown in FIG. 6, interlayer a first insulating film01 is deposited on the entire surface, and then planarized using a usual CMP technique. At this time, the above silicon nitride film 8 acts as a stopper in planarization.

Figure 7:
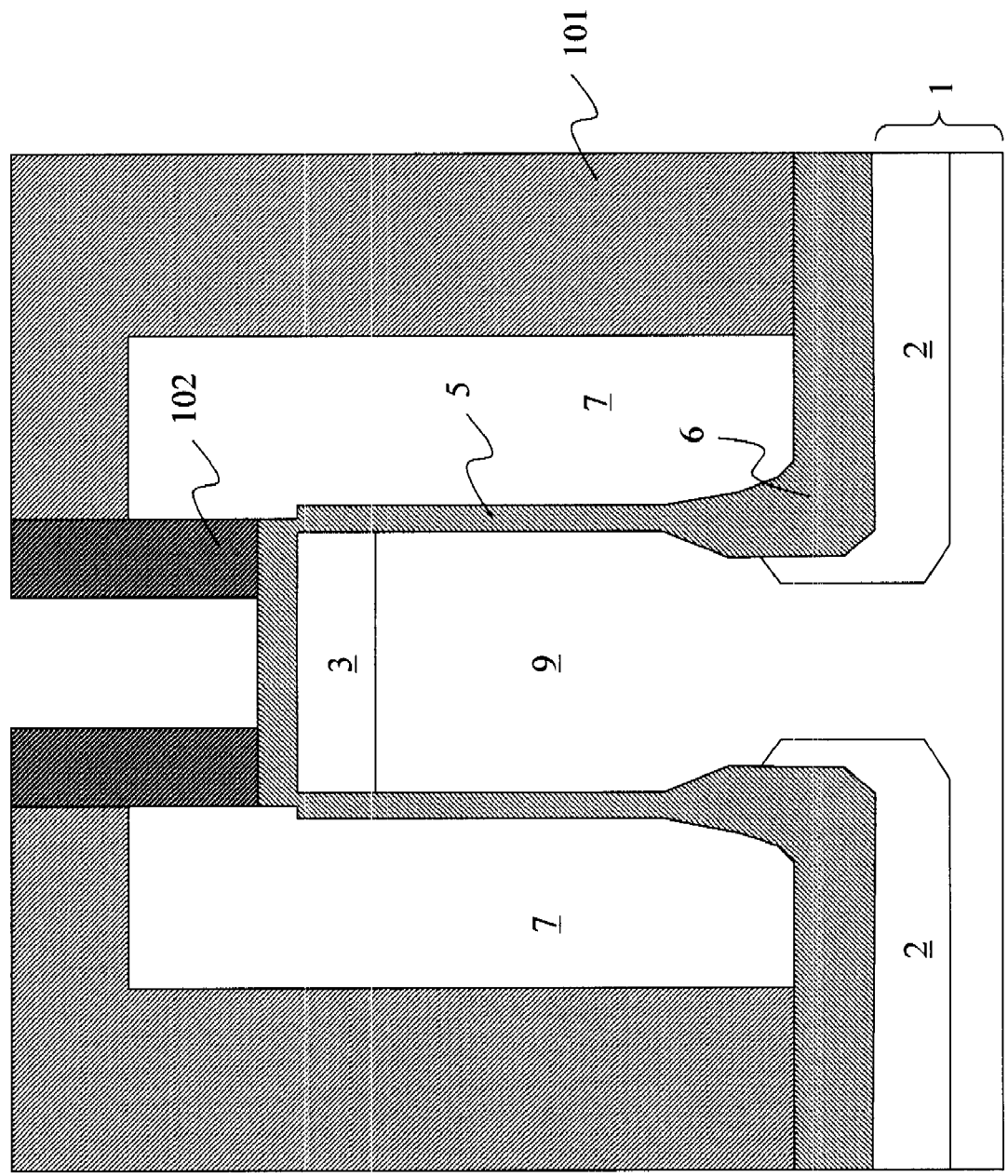
FIG. 7 is a cross-sectional view showing one step of the method for manufacturing a vertical MOS transistor according to Example 1.

Next, as shown in FIG. 7, silicon nitride film 8 is removed, and then, silicon nitride film 102 having a film thickness of 20 nm is deposited. Then, further, etching back is performed to form side spacer 102 on protrusion-like region 9, and then, an impurity is ion implanted to make the upper portion of protrusion-like region 9 upper impurity diffusion region 3. Also, at this time, the region of a portion under upper impurity diffusion region 3 of protrusion-like region 9 is a channel region (FIG. 7). Lastly, embedded electrode 103 is formed in communication with upper impurity diffusion region 3, so that the vertical MOS transistor shown in FIG. 1 can be manufactured.

A Second Embodiment

A vertical MOS transistor of the second embodiment comprising:
a first insulating film between a lower impurity diffusion region in semiconductor substrate and a gate electrode;
a gate insulating film constituted by a second insulating film between a channel region and a gate electrode; and
a third insulating film between an upper impurity diffusion region and a gate electrode,
wherein the film thickness of the first and the third insulating films is thicker than the film thickness of a gate insulating film.

Figure 8:
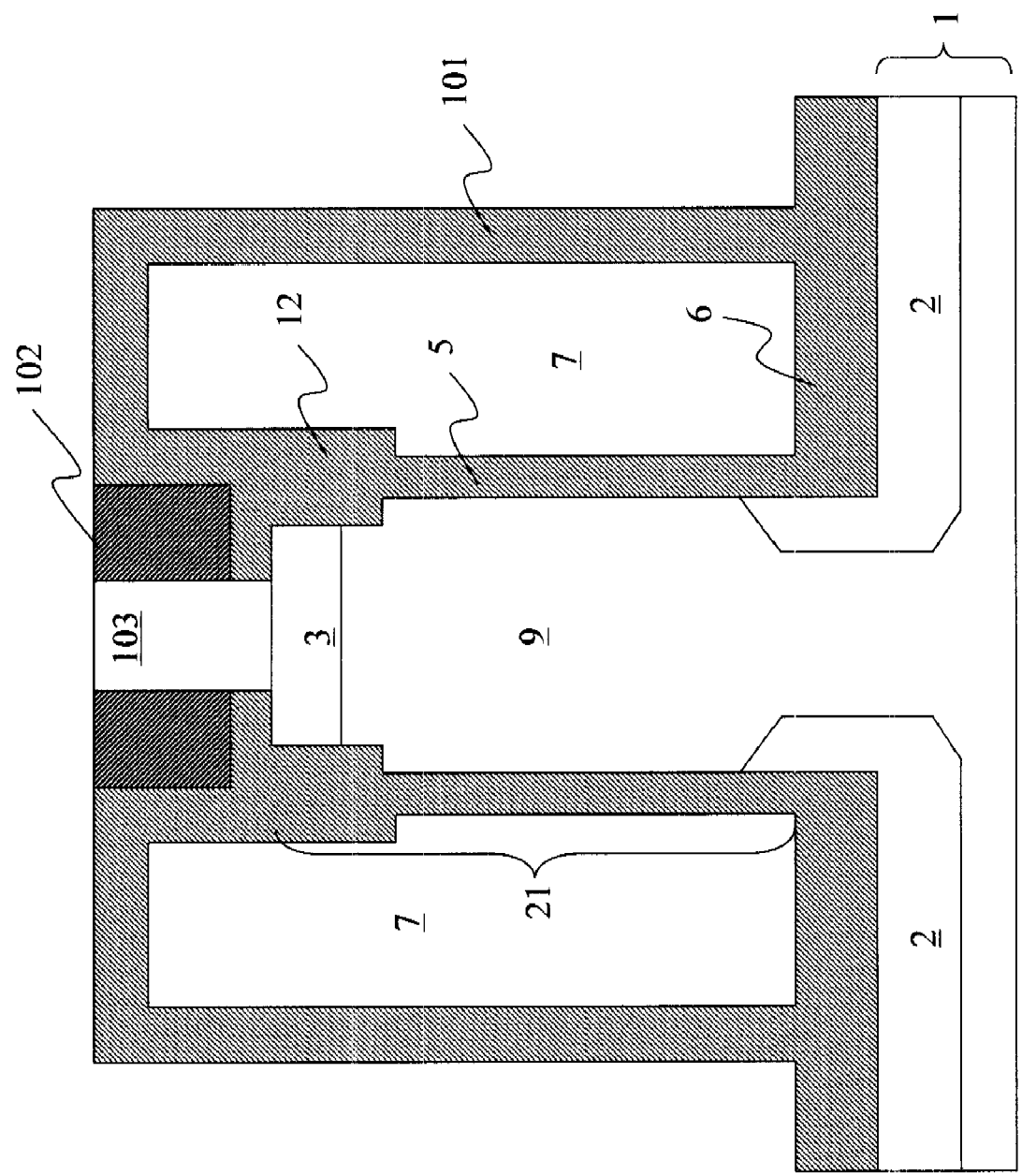
FIG. 8 is a cross-sectional view showing the vertical MOS transistor of Example 2.

One example of this vertical MOS transistor is shown in FIG. 8. As shown in FIG. 8, protrusion-like region 21 is provided on P-type Si semiconductor substrate 1. Lower impurity diffusion region 2 is provided in a region from a lower portion in this protrusion-like region 21 into semiconductor substrate 1, and upper impurity diffusion region 3 is provided in an upper portion in protrusion-like region 21. Also, a channel region is formed between upper impurity diffusion region 3 and lower impurity diffusion region 2 in protrusion-like region 21.

This lower impurity diffusion region 2 is provided extending from the lower portion in protrusion-like region 21 into semiconductor substrate 1, as shown in FIG. 8. Lower impurity diffusion region 2 may occupy a part of the lower region of the protrusion-like region or may occupy all of the lower region, as long as it is present in at least a part of the lower region in protrusion-like region 21.

Gate electrode 7 is provided on this lower impurity diffusion region 2 in semiconductor substrate 1 and on the side of protrusion-like region 21. Also, insulating films 5, 6, and 12 are provided between lower impurity diffusion region 2 in semiconductor substrate 1 and gate electrode 7 and between the side of protrusion-like region 21 and gate electrode 7. Among these insulating films, the portion between gate electrode 7 and the side of the channel region is second insulating film which makes up gate insulating film 5. Among these insulating films, insulating film 6 between lower impurity diffusion region 2 and gate electrode 7 makes up first insulating film, and first insulating film 2 between upper impurity diffusion region 3 and gate electrode 7 makes up third insulating film. The film thickness of these second and third insulating films is thicker than the film thickness of gate insulating film 5.

When the film thickness of first and third insulating films and the gate insulating film is not constant and varies, it is defined that "the film thickness of first and third insulating films is thicker than the film thickness of the gate insulating film" when the film thickness of at least part of first and third insulating films is thicker than the maximum film thickness of the gate insulating film in the vertical MOS transistor of this exemplary embodiment. The film thickness of part of a first and third insulating films may be the same as the maximum film thickness of the gate insulating film.

By the film thickness of first insulating film A (numeral 6) and third insulating film B (numeral 12) being thicker than the film thickness of gate insulating film 5 in this manner, the distance between lower impurity diffusion region 2 and gate electrode 7 and between upper impurity diffusion region 3 and gate electrode 7 can be long. As a result, the occurrence of junction leak current due to GIDL can be prevented.

One example of manufacturing method of the second embodiment will be described below with reference to the drawings.

First, as in the steps of the above method for manufacturing the first embodiment, protrusion-like region 9 is formed on P-type Si semiconductor substrate 1, and silicon oxide film 10 for protection and a spacer of silicon nitride film 11 are formed on the side of protrusion-like region 9 (FIG. 3). Next, by thermally oxidizing, the film thickness of silicon oxide film 10 is increased on the part of P-type Si semiconductor substrate 1 except protrusion-like region 9 to form first insulating film (numeral 6). This first insulating film A (numeral 6) may be formed by a method such as the above method for manufacturing the first embodiment or may be formed by a CVD method controlling a deposition component and a sputtering component.

Figure 9:
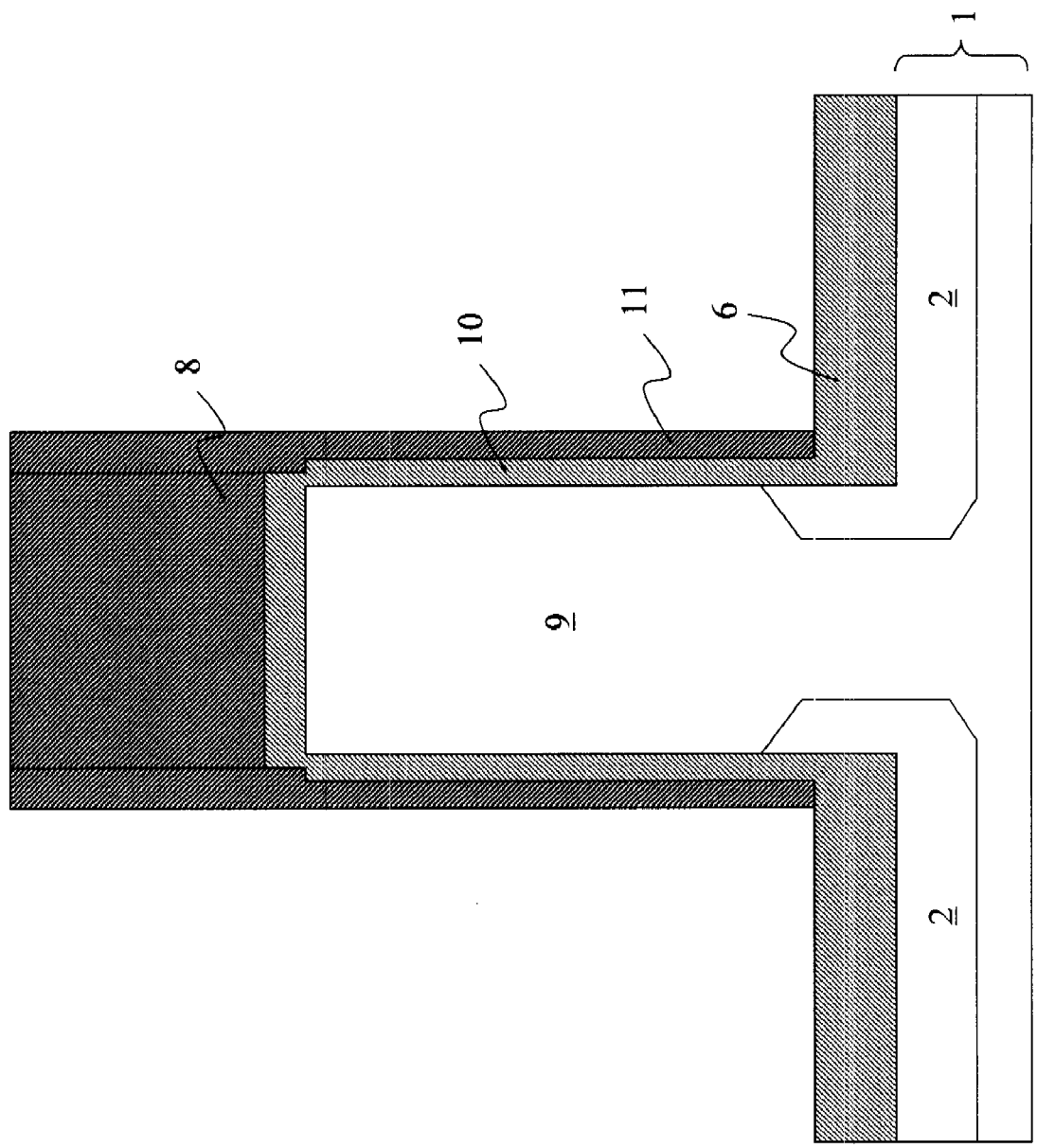
FIG. 9 is a cross-sectional view showing one step of a method for manufacturing a vertical MOS transistor according to Example 2.
Figure 10:
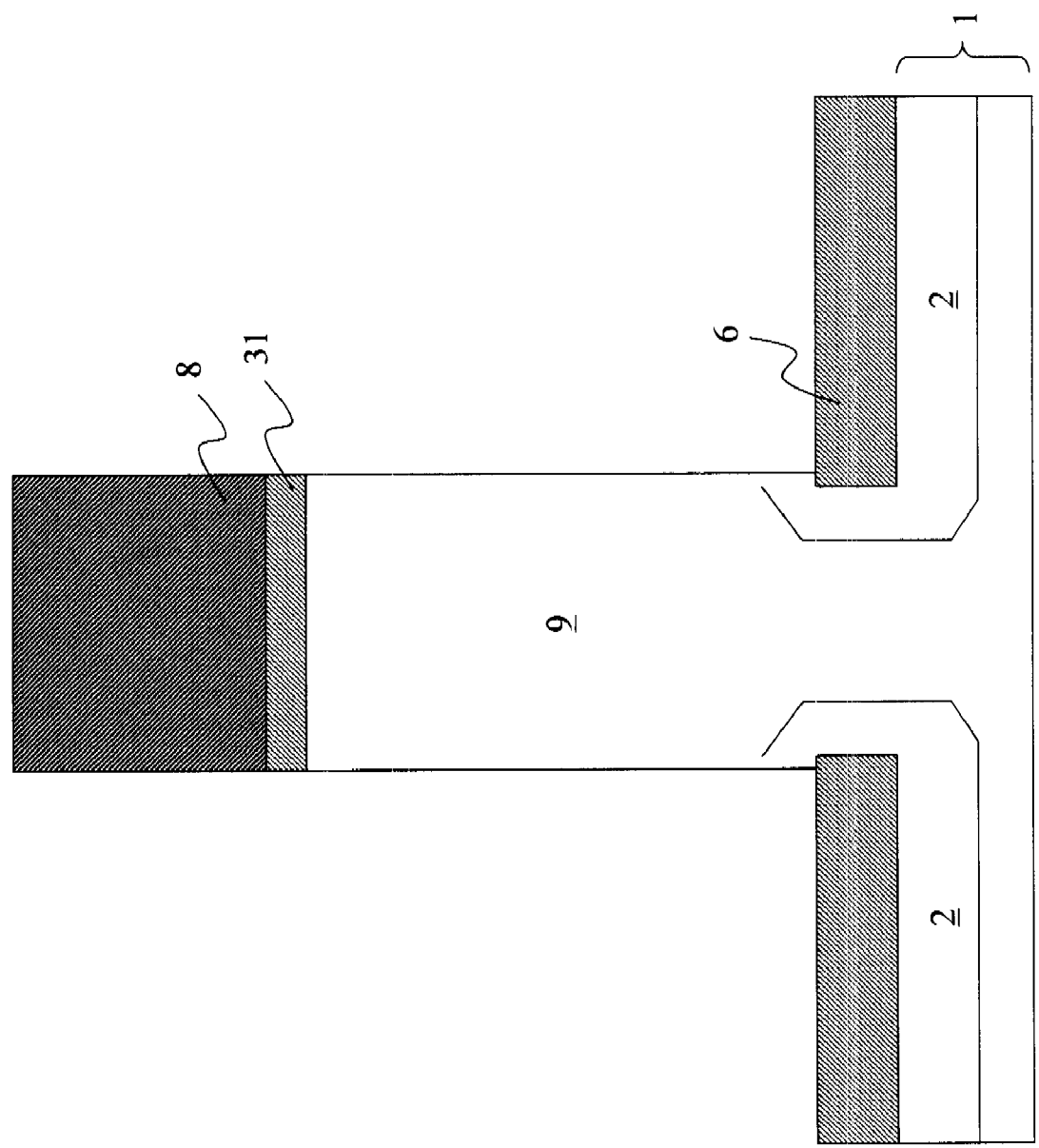
FIG. 10 is a cross-sectional view showing one step of the method for manufacturing a vertical MOS transistor according to Example 2.

Next, using the mask pattern as a mask, an impurity is ion implanted into the portion in P-type silicon substrate 1 except the part where protrusion-like region 9 is formed, and heat treatment is performed to form lower impurity diffusion region 2 in P-type silicon substrate 1 (FIG. 9). Next, silicon nitride film 11 and the portion of the above silicon oxide film 10 for protection on the part except first insulating film (numeral 6) are removed to expose the silicon side of protrusion-like region 9 (FIG. 10).

Figure 11:
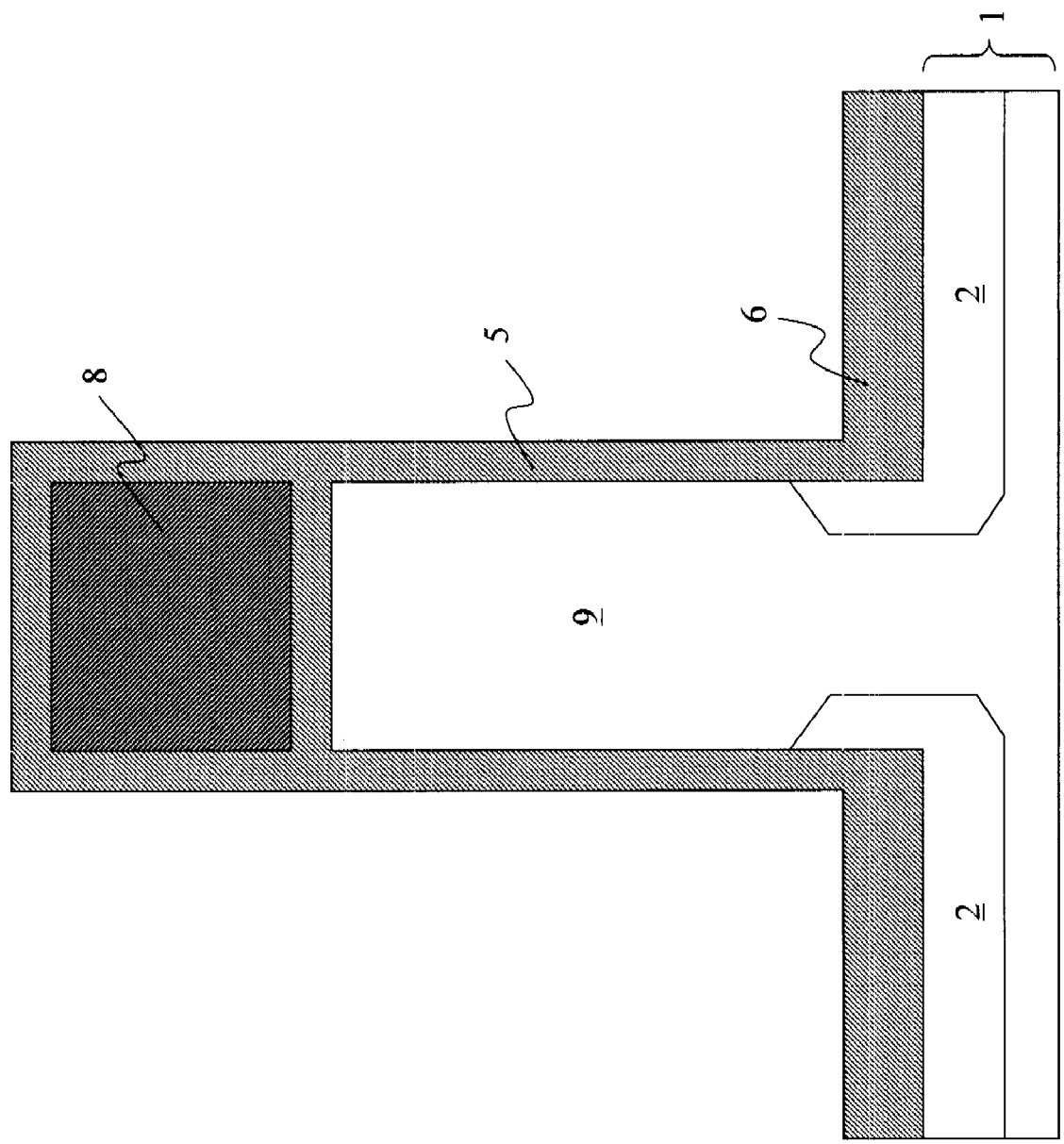
FIG. 11 is a cross-sectional view showing one step of the method for manufacturing a vertical MOS transistor according to Example 2.

Next, as shown in FIG. 11, thermal oxidation in which the oxidation speed of silicon and silicon nitride is equal is performed to form silicon oxide film (second insulating film) 5 on the exposed silicon side of protrusion-like region 9 and the upper surface and side of mask pattern 8. At this time, a gate insulating film is formed on the side of the portion of protrusion-like region 9 except the upper portion.

Figure 12:
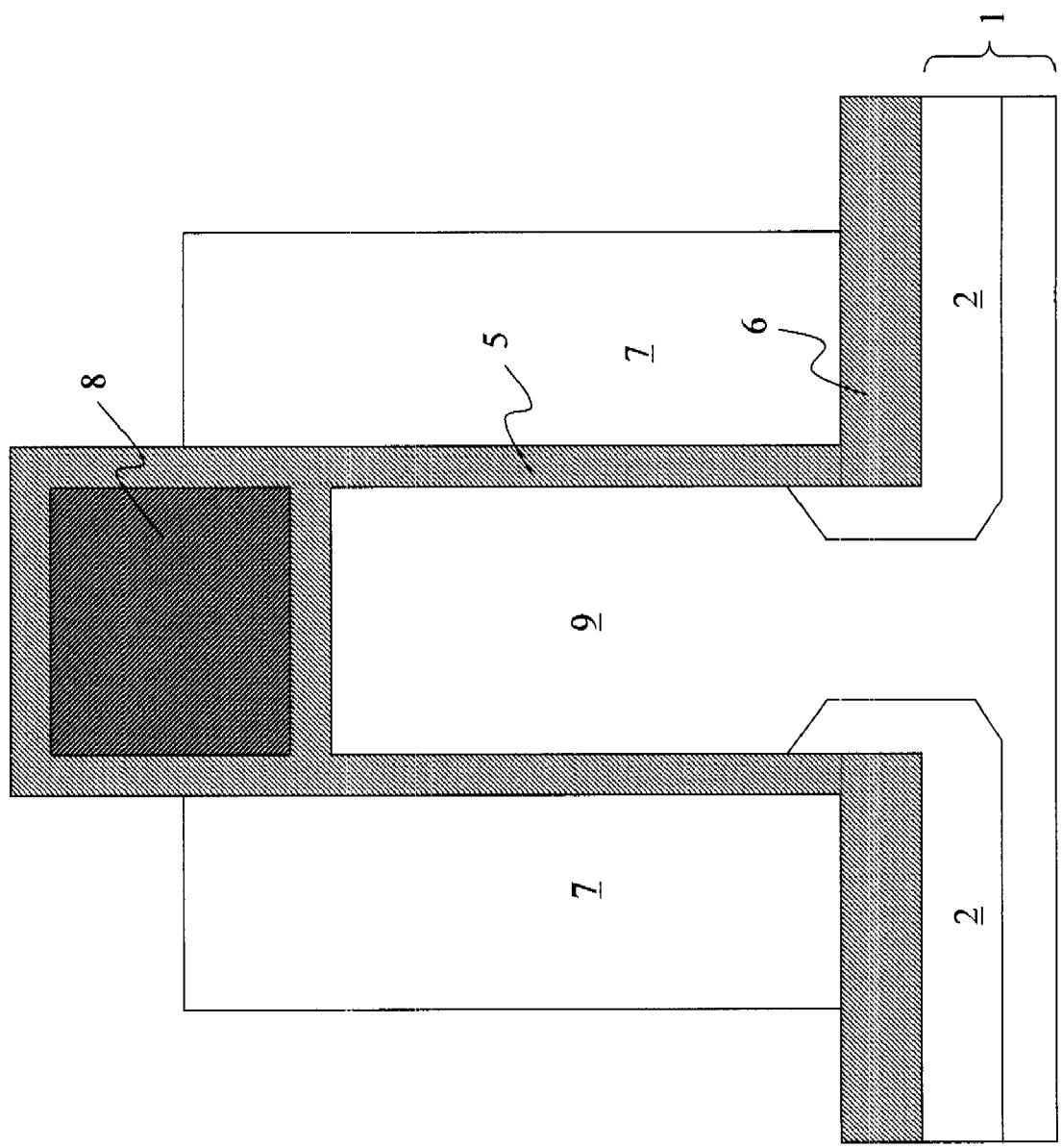
FIG. 12 is a cross-sectional view showing one step of the method for manufacturing a vertical MOS transistor according to Example 2.

Further, a polycrystalline silicon film into which an impurity is introduced is deposited on the entire surface, and then, etching back is performed to form gate electrode 7 on lower impurity diffusion region 2 and the side of protrusion-like region 9 (on first insulating film 6 and gate insulating film 5) (FIG. 12).

Figure 13:
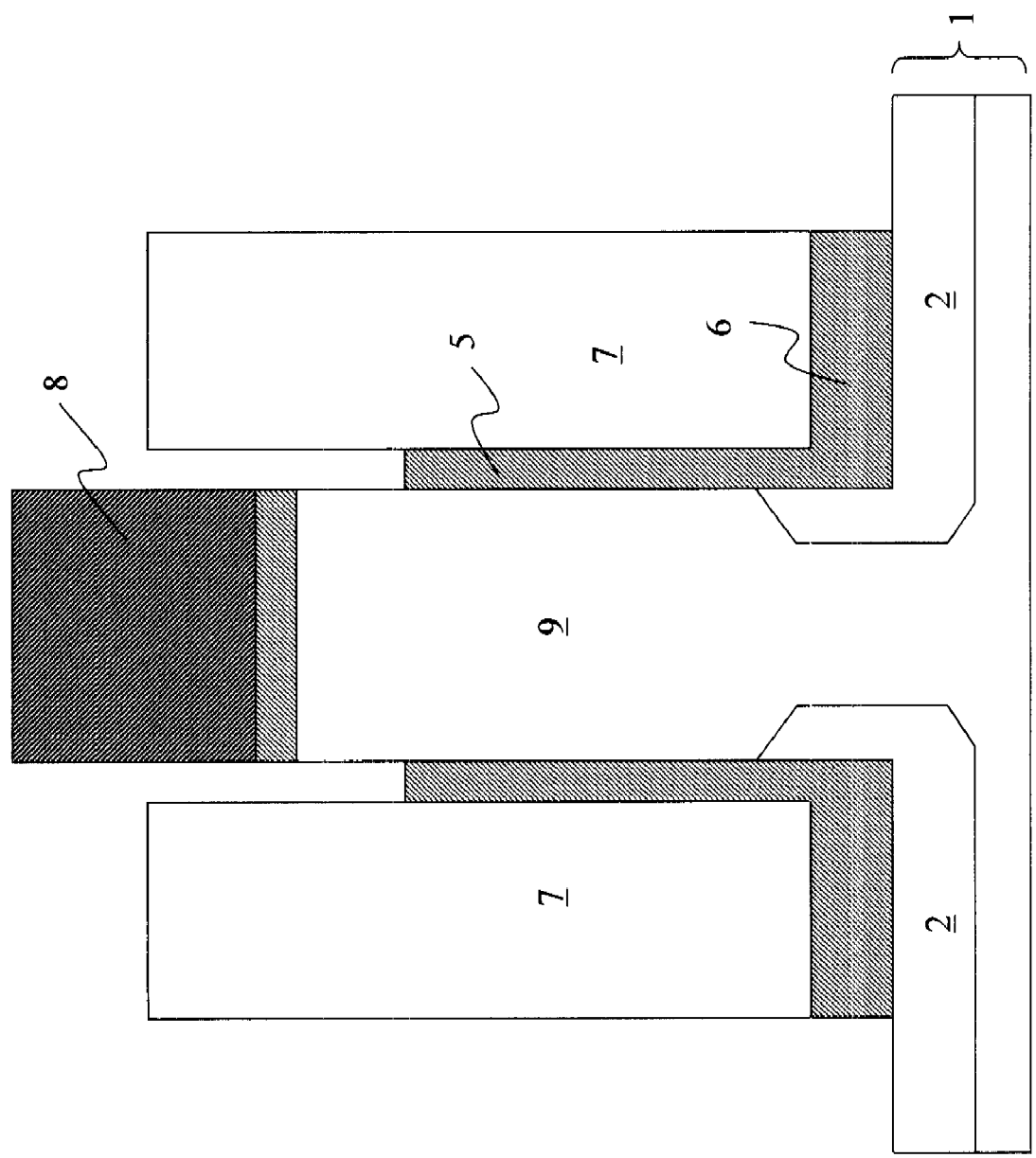
FIG. 13 is a cross-sectional view showing one step of the method for manufacturing a vertical MOS transistor according to Example 2.
Figure 14:
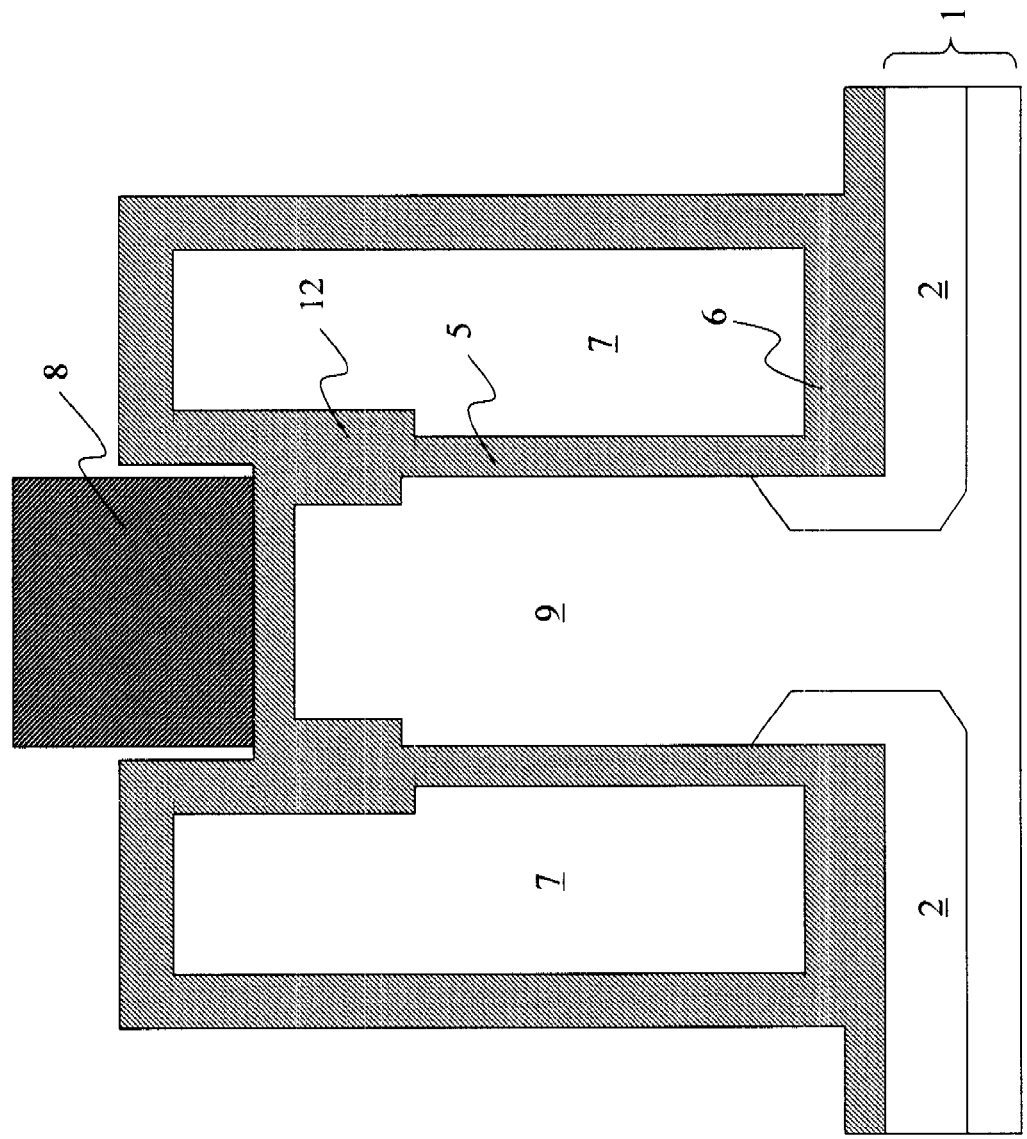
FIG. 14 is a cross-sectional view showing one step of the method for manufacturing a vertical MOS transistor according to Example 2.

Next, as shown in FIG. 13, the insulating film on the upper portion side of protrusion-like region 9 is removed by anisotropic dry etching, so that the insulating film remains on the side of the portion of protrusion-like region 9 except the upper portion. At this time, the upper portion of gate electrode 7 opposed to the side of the upper portion of protrusion-like region 9 is exposed. Next, thermal oxidation is performed in a dry oxygen atmosphere to form third insulating film (numeral 12) on the upper portion side of protrusion-like region 9. At this time, thermal oxidation also proceeds laterally, so that the thickness of third insulating film (numeral 12) is thicker than the thickness of gate insulating film 5, and no void is present between the upper portion of protrusion-like region 9 and the upper portion of gate electrode 7 (FIG. 14).

Figure 15:
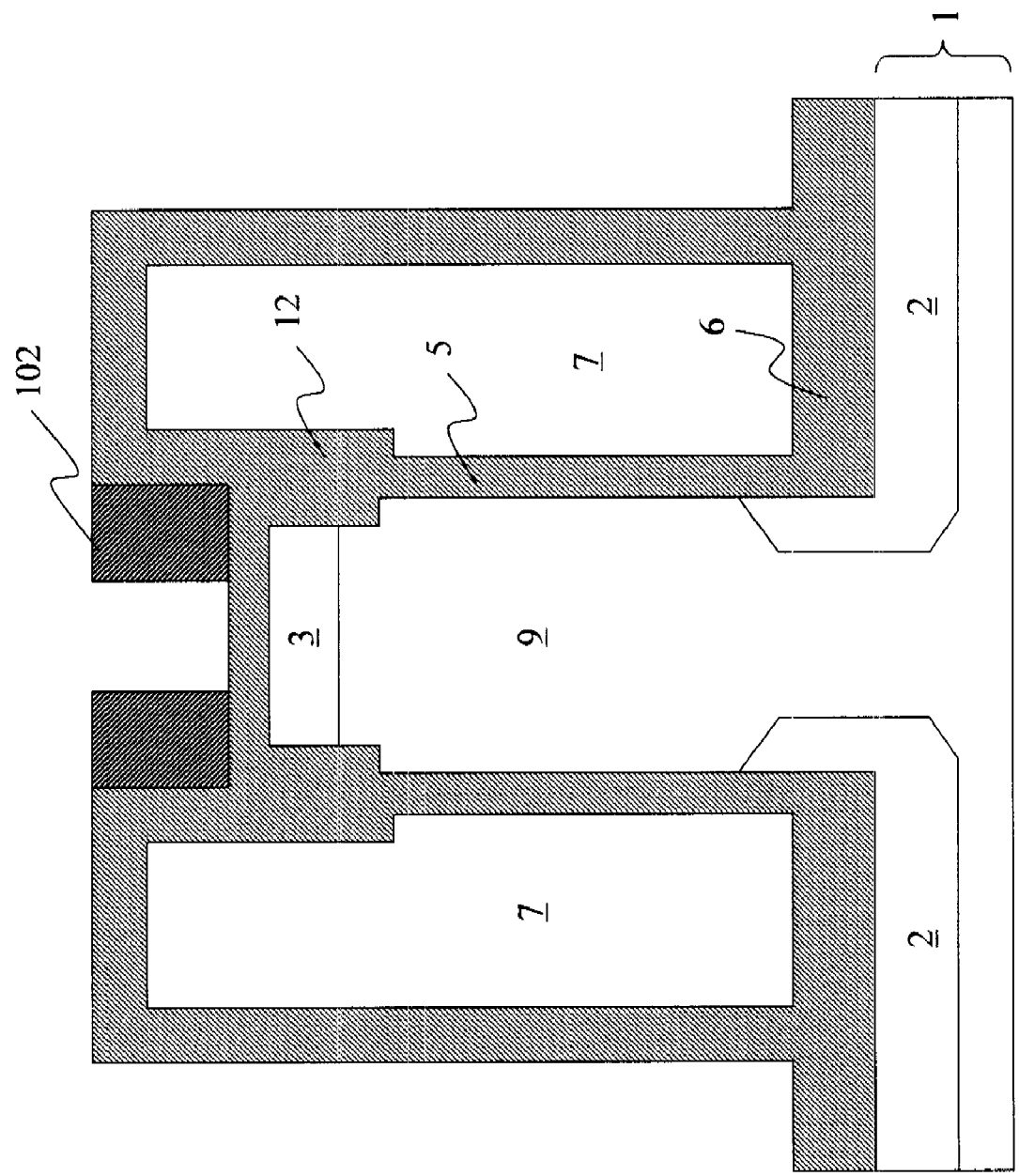
FIG. 15 is a cross-sectional view showing one step of the method for manufacturing a vertical MOS transistor according to Example 2.

Then, as shown in FIG. 15, the mask pattern of silicon nitride film 8 is removed, and then, silicon nitride film 102 is newly deposited and etched back to form a spacer. Next, impurity ion implantation and heat treatment are performed to make the upper portion of protrusion-like region 9 upper impurity diffusion region 3. Also, at this time, a portion under upper impurity diffusion region 3 of protrusion-like region 9 is a channel region. Lastly, embedded electrode 103 is formed in communication with upper impurity diffusion region 3, so that the vertical MOS transistor shown in FIG. 8 can be manufactured.

Preferably, an oxide film 10 having a film thickness of 5 nm to 10 nm is formed. Preferably, thermal oxidation is performed in a dry oxygen atmosphere or in a water vapor atmosphere at 800 to 1000° C. to form a $SiO_2$ film having a film thickness of 10 nm to 30 nm as third insulating film. By performing thermal oxidation under such conditions, the film thickness of third insulating film can be made thicker than the film thickness of the gate insulating film stably and reliably.

A Third Embodiment

A vertical MOS transistor of the third embodiment comprising:

a first insulating film between a lower impurity diffusion region in semiconductor substrate and a gate electrode;

a gate insulating film constituted by a second insulating film between a channel region and a gate electrode; and an insulating region constituted by a forth insulating film, a fifth insulating film and air gap region between an upper impurity diffusion region and a gate electrode, wherein the film thickness of the first insulating film and the effective film thickness of the insulating region are thicker than the film thickness of a gate insulating film.

Figure 16:
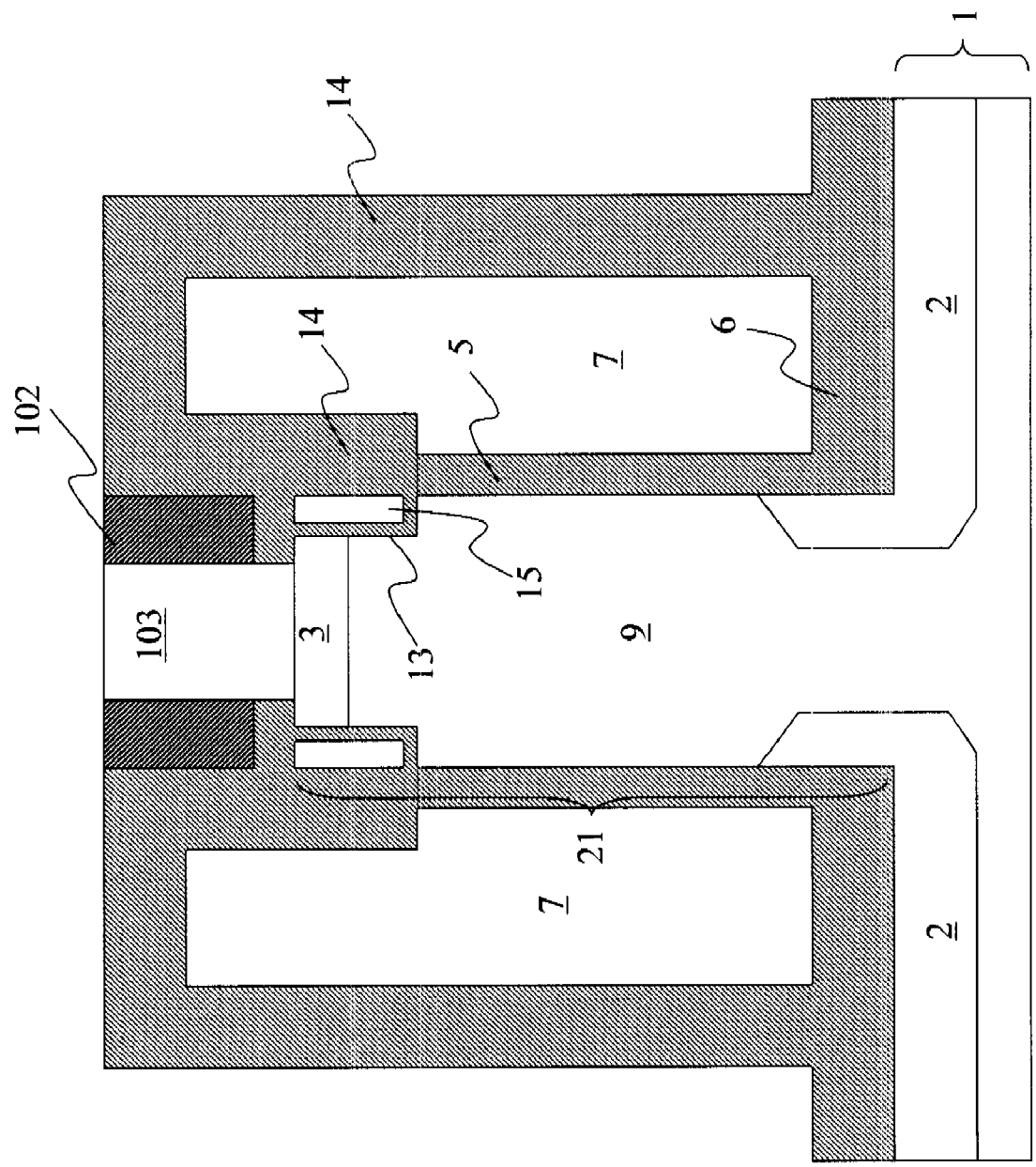
FIG. 16 is a cross-sectional view showing the vertical MOS transistor of Example 3.

One example of vertical MOS transistor of this embodiment is shown in FIG. 16. As shown in FIG. 16, protrusion-like region 21 is provided on P-type Si semiconductor substrate (silicon semiconductor substrate) 1. Lower impurity diffusion region 2 is provided in a region from a lower portion in this protrusion-like region 21 into semiconductor substrate 1, and further, upper impurity diffusion region 3 is provided in an upper portion in protrusion-like region 21. Also, a channel region is formed between upper impurity diffusion region 3 and lower impurity diffusion region 2 in protrusion-like region 21.

This lower impurity diffusion region 2 is provided extending from the lower portion in protrusion-like region 21 into semiconductor substrate 1, as shown in FIG. 16. Lower impurity diffusion region 2 may occupy a part of the lower region of the protrusion-like region or may occupy all of the lower region, as long as it is present in at least a part of the lower region in protrusion-like region 21.

Gate electrode 7 is provided on this lower impurity diffusion region 2 in semiconductor substrate 1 and on the side of protrusion-like region 21. Also, insulating films 5, 6, 13, and 14, and air gap region 15 are provided between lower impurity diffusion region 2 in semiconductor substrate 1 and gate electrode 7 and between the side of protrusion-like region 21 and gate electrode 7. Among these insulating films and the like, the portion between gate electrode 7 and the side of the channel region makes up gate insulating film 5. Among these insulating films, insulating film 6 between lower impurity diffusion region 2 and gate electrode 7 makes up first insulating film. Also, insulating films 13 and 14 between upper impurity diffusion region 3 and gate electrode 7 and air gap region 15 make up insulating region. Insulating films 13 and 14 make up forth insulating film and fifth insulating film. The film thickness of this insulating film 6 and the effective film thickness of insulating region are each thicker than the film thickness of gate insulating film 5. "The effective film thickness of insulating region" indicates the total film thickness of the film thickness of insulating films 13 and 14 and the film thickness of a $SiO_2$ film having a resistance value equal to that of air gap region 15.

Also, when the film thickness of first insulating film, the effective film thickness of insulating region, and the film thickness of the gate insulating film are not constant and vary, it is defined that "the film thickness of first insulating film and the effective film thickness of insulating region are thicker than the film thickness of the gate insulating film" when the film thickness of at least part of first insulating film and the effective film thickness of at least part of insulating region are thicker than the maximum film thickness of the gate insulating film in the vertical MOS transistor of this exemplary embodiment. The film thickness of part of a first insulating film and the effective film thickness of part of insulating region may be the same as the maximum film thickness of the gate insulating film.

By the thickness of first insulating film and the effective film thickness of insulating region each being thicker than the film thickness of gate insulating film 5 in this manner, the distance between the lower impurity diffusion region and the gate electrode and between the upper impurity diffusion region and the gate electrode can be increased, so that the occurrence of junction leak current due to GIDL can be prevented.

One example of manufacturing method of this embodiment will be described below with reference to the drawings.

First, as the above method for manufacturing the first embodiment, protrusion-like region 9 is formed on P-type Si semiconductor substrate 1, and silicon oxide film 10 for protection and a spacer of silicon nitride film 11 are formed on the side of protrusion-like region 9 (FIG. 3). Next, by thermally oxidizing, the film thickness of silicon oxide film is increased on the part of P-type Si semiconductor substrate 1 except protrusion-like region 9 to form first insulating film (numeral 6). This first insulating film 6 may be formed by a method such as the above method for manufacturing the first embodiment or may be formed by a CVD method controlling a deposition component and a sputtering component.

Next, using the mask pattern as a mask, an impurity is ion implanted into the portion in P-type silicon substrate 1 except the part where protrusion-like region 9 is formed, and heat treatment is performed to form lower impurity diffusion region 2 in P-type silicon substrate 1 (FIG. 9). Next, silicon nitride film 11 and the portion of silicon oxide film 10 for protection except first insulating film (numeral 6) are removed to expose the silicon side of protrusion-like region 9 (FIG. 10).

Next, as shown in FIG. 11, thermal oxidation in which the oxidation speed of silicon and silicon nitride is equal is performed to form silicon oxide film (second insulating film) 5 on the exposed silicon side of protrusion-like region 9 and the upper surface and side of mask pattern 8. At this time, a gate insulating film is formed on the side of the portion of protrusion-like region 9 except the upper portion.

Further, a polycrystalline silicon film into which an impurity is introduced is deposited on the entire surface, and then, etching back is performed to form gate electrode 7 on lower impurity diffusion region 2 and the side of protrusion-like region 9 (on first insulating film 6 and gate insulating film 5) (FIG. 12).

Figure 17:
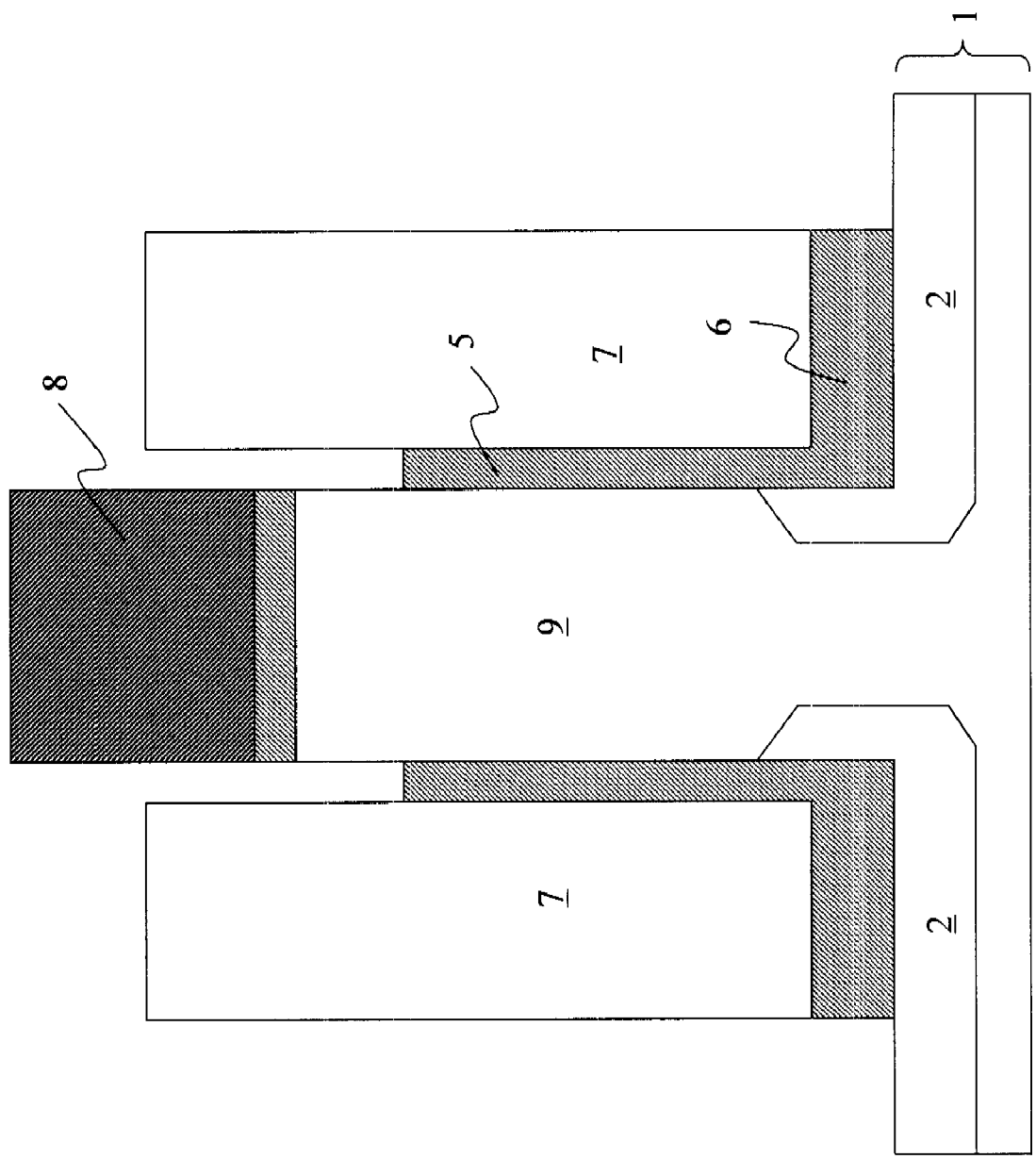
FIG. 17 is a cross-sectional view showing one step of a method for manufacturing a vertical MOS transistor according to Example 3.

Next, as shown in FIG. 17, the insulating film on the upper portion side of protrusion-like region 9 is removed by anisotropic dry etching, so that the second insulating film remains on the side of the portion of protrusion-like region 9 except the upper portion. At this time, the upper portion of gate electrode 7 opposed to the side of the upper portion of protrusion-like region 9 is exposed.

Figure 18:
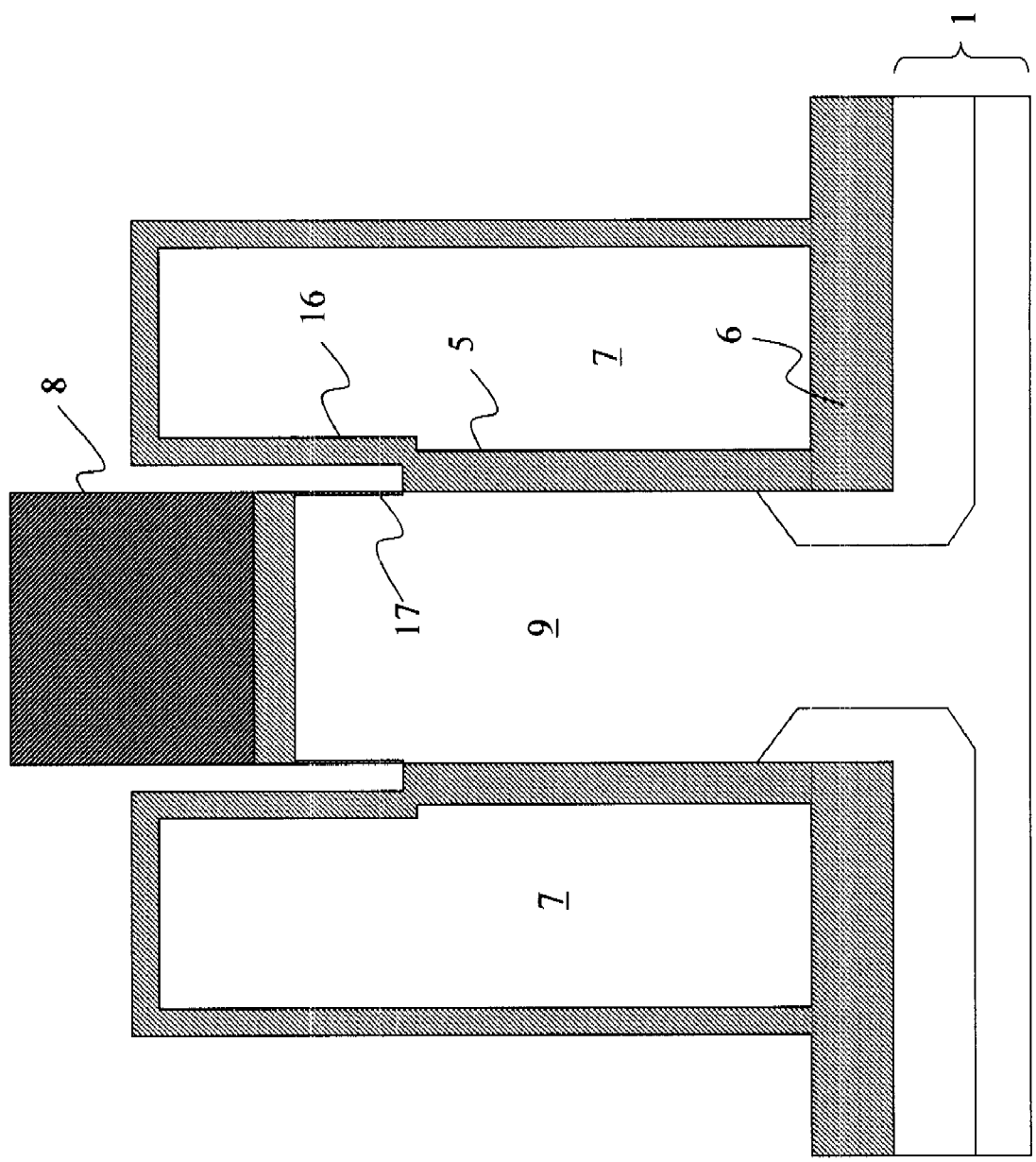
FIG. 18 is a cross-sectional view showing one step of the method for manufacturing a vertical MOS transistor according to Example 3.

Then, as shown in FIG. 18, the upper portion sides of protrusion-like region 9 and the gate electrode opposed to the upper portion side of protrusion-like region 9 are thermally oxidized to form silicon oxide film 17 (forth insulating film) on the upper portion sides of protrusion-like region 9 and the gate electrode. At this time, the above silicon oxide films 16 and 17 are formed so that a void is created between the upper portion side of protrusion-like region 9 and the upper portion side of the gate electrode. Also, in this step, by lowering the temperature of thermal oxidation, the film thickness of silicon oxide film 17 can be thin, and the film thickness of silicon oxide film 16 can be thick.

Figure 19:
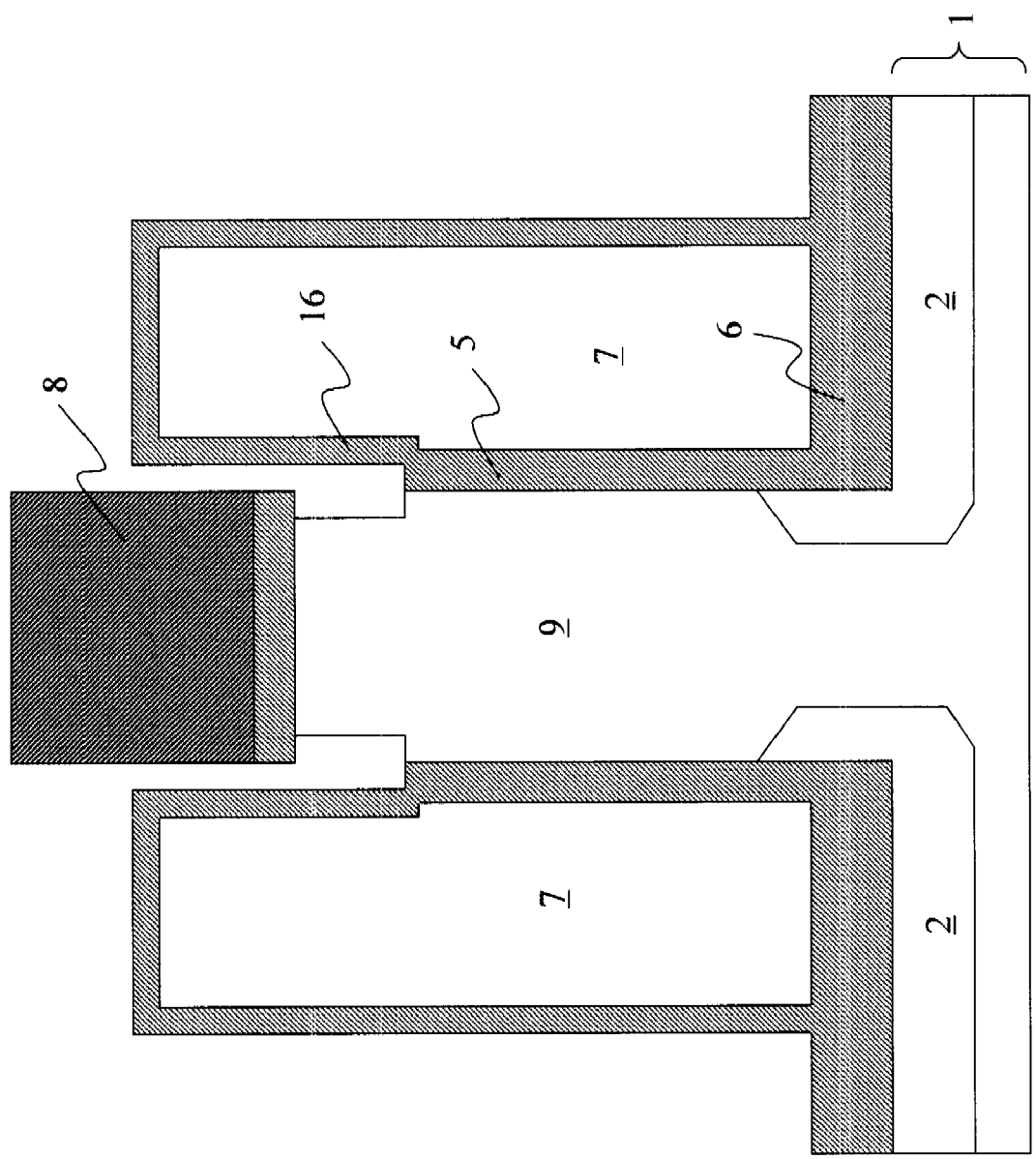
FIG. 19 is a cross-sectional view showing one step of the method for manufacturing a vertical MOS transistor according to Example 3.

Next, as shown in FIG. 19, silicon oxide film 17 (forth insulating film) and the upper portion side of protrusion-like region 9 on which silicon oxide film 17 is provided are etched to narrow and expose the upper portion of protrusion-like region 9.

Figure 20:
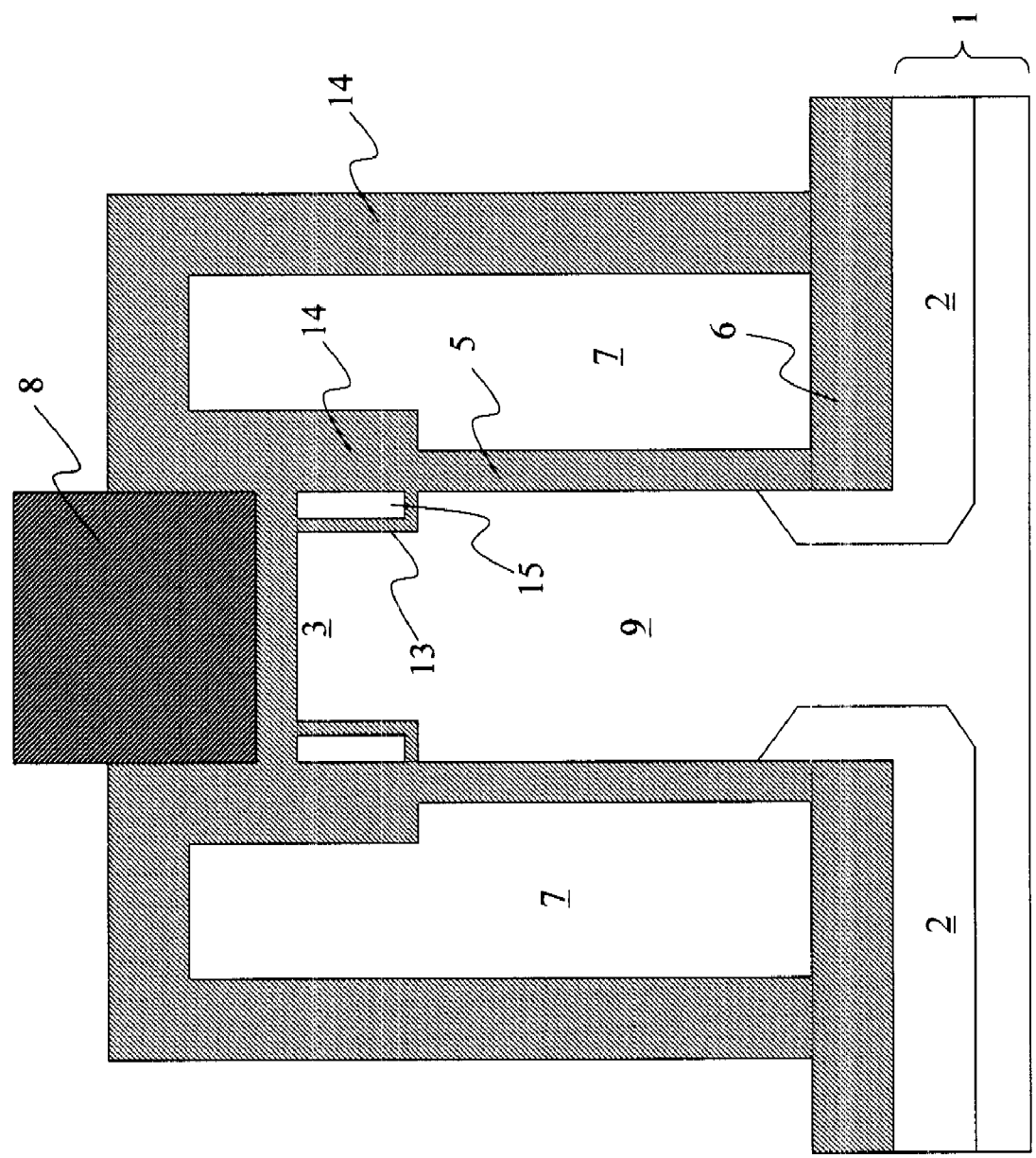
FIG. 20 is a cross-sectional view showing one step of the method for manufacturing a vertical MOS transistor according to Example 3.

Then, as shown in FIG. 20, thermal oxidation is performed again so that the void remains as air gap region 15. Further, fifth insulating film is formed between the upper portion side of protrusion-like region 9 and the upper portion side of gate electrode 7 opposed to the upper portion side of protrusion-like region 9 to form insulating region. In this exemplary embodiment, a first insulating film 3, air gap region 15, and a first insulating film 4 make up "insulating region between the upper impurity diffusion region and the gate electrode," and this insulating region also includes air gap region 15. In other words, in this exemplary embodiment, insulating films 13 and 14 newly formed (these include a first insulating film 6 formed on the upper portion side of the gate electrode) and remaining air gap region 15 make up insulating region.

Figure 21:
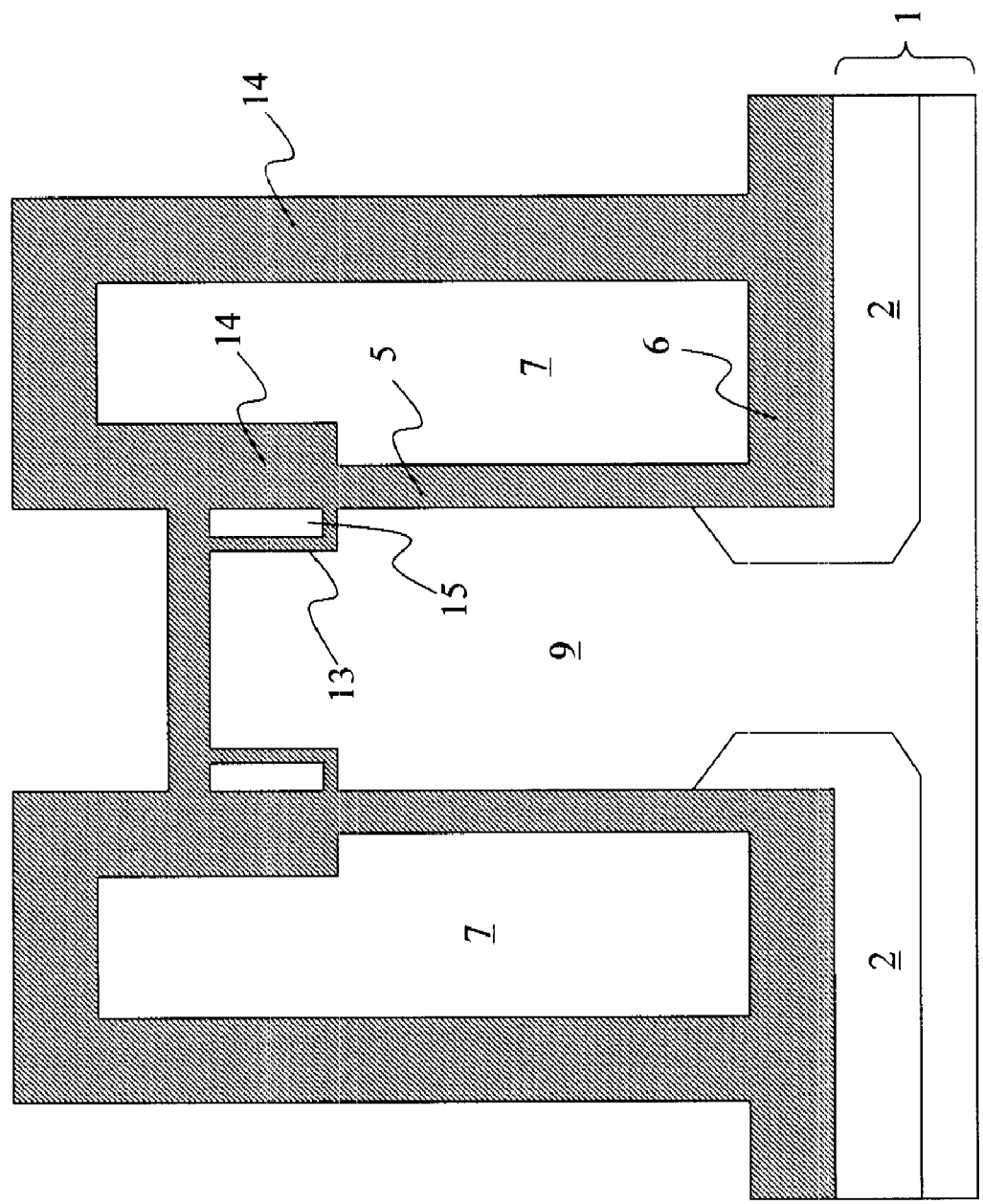
FIG. 21 is a cross-sectional view showing one step of the method for manufacturing a vertical MOS transistor according to Example 3.
Figure 22:
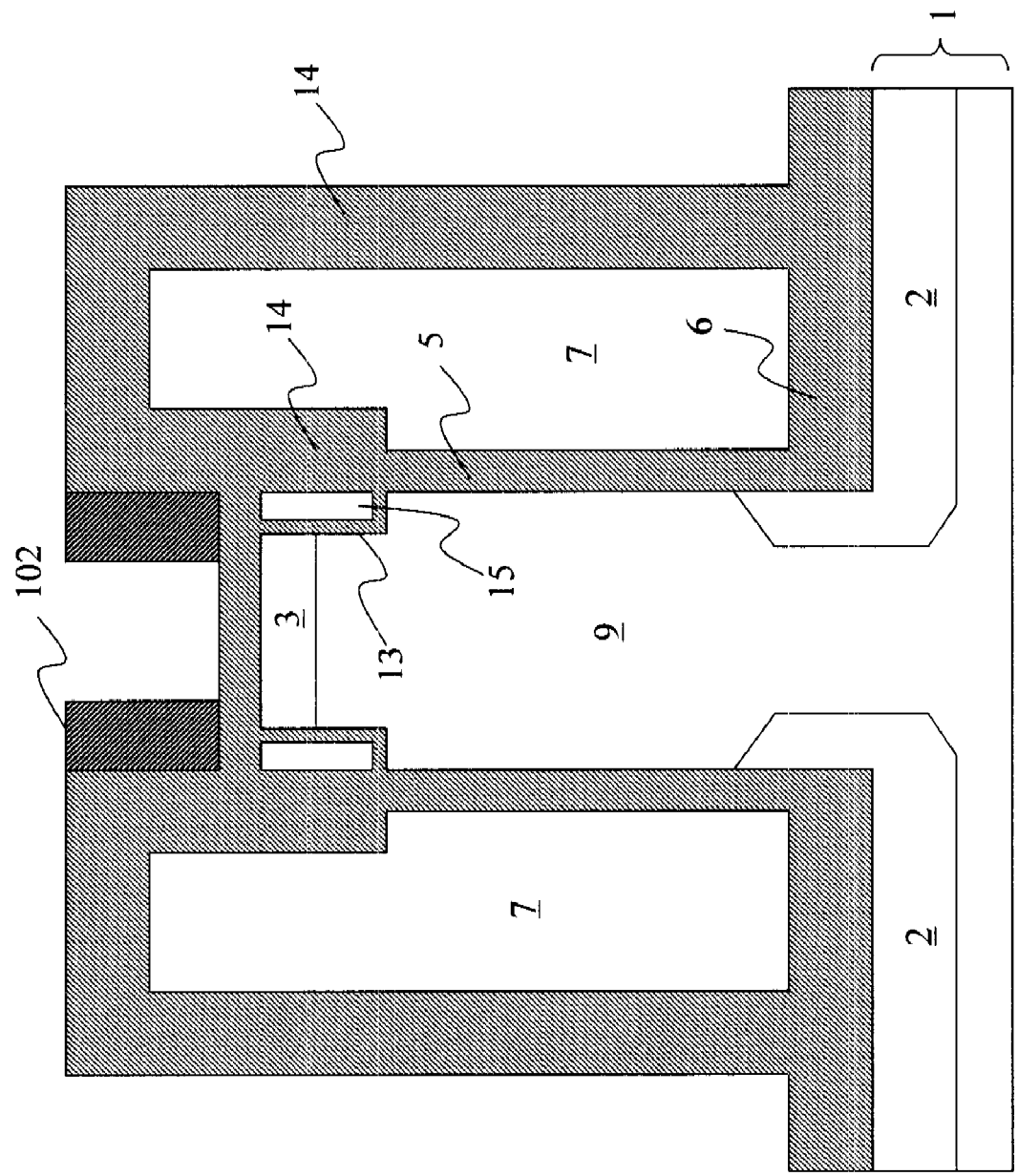
FIG. 22 is a cross-sectional view showing one step of the method for manufacturing a vertical MOS transistor according to Example 3.
Figure 23:
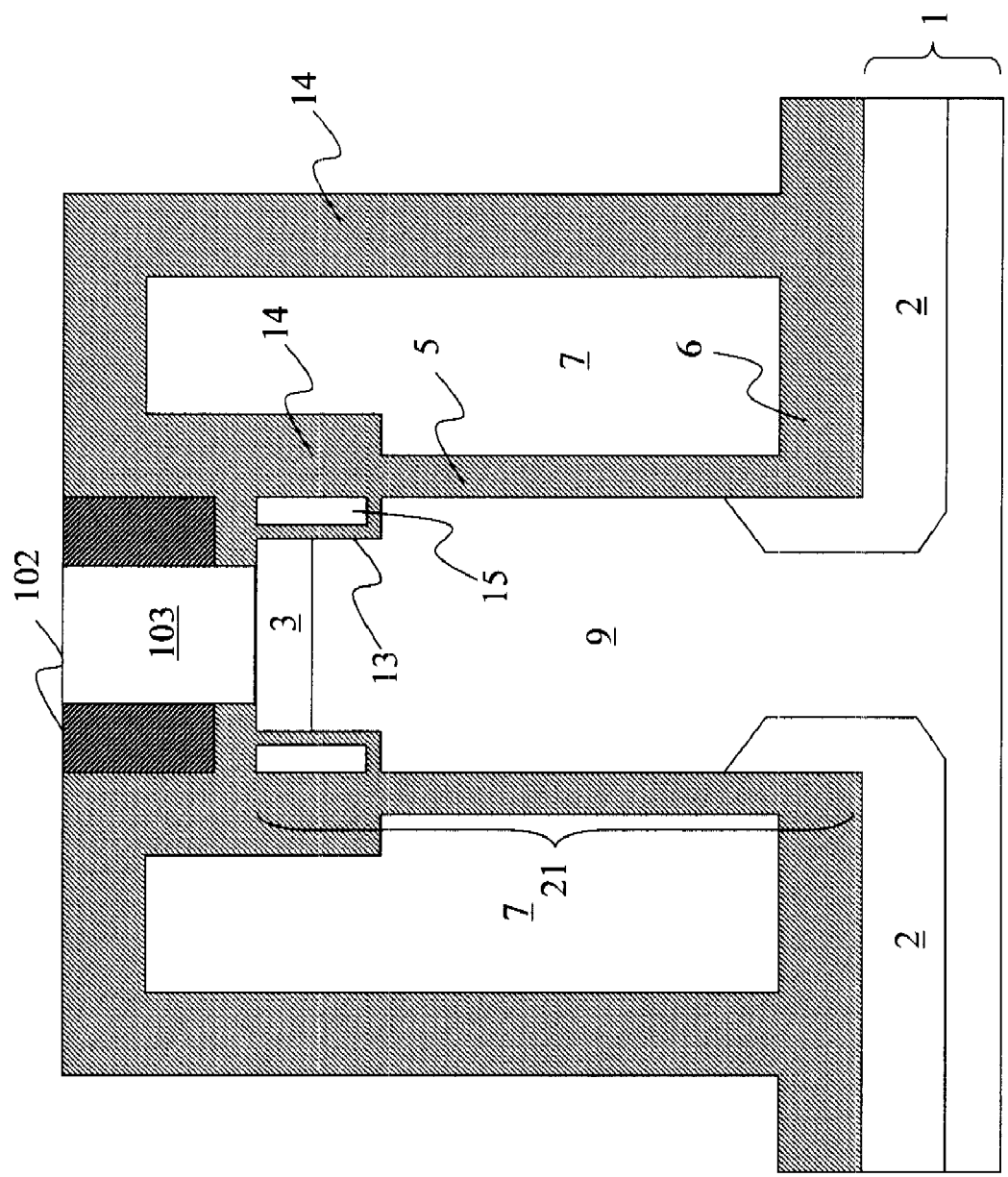
FIG. 23 is a cross-sectional view showing one step of the method for manufacturing a vertical MOS transistor according to Example 3.

Then, as shown in FIG. 21, the mask pattern of silicon nitride film 8 is removed, and then, silicon nitride film 102 is newly deposited and etched back to form a spacer. Next, impurity is ion-implanted, and heat treatment is performed to make the upper portion of protrusion-like region 9 upper impurity diffusion region 3. Also, at this time, a portion under upper impurity diffusion region 3 in protrusion-like region 9 is a channel region (FIG. 22). Lastly, embedded electrode 103 is formed in communication with upper impurity diffusion region 3, so that the vertical MOS transistor shown in FIG. 23 can be manufactured.

Also, step of forming the fifth insulating film is preferably the step of performing thermal oxidation in an oxidizing atmosphere containing water vapor in a temperature range of 650° C. to 850° C. This is because when the temperature of thermal oxidation is less than 650° C., long oxidation time is required, so that the productivity may decrease, and when the temperature of thermal oxidation is more than 850° C., the air gap may not be efficiently formed.

EXAMPLES

Example 1

Example 1 will be described below in detail with reference to FIGS. 1 to 7. This example corresponds to the above method for manufacturing the first embodiment.

First, as shown in FIG. 2, P-type silicon semiconductor substrate 1 (boron concentration: $5\times10^{17}/cm^3$) was prepared, and then, a surface of P-type silicon semiconductor substrate 1 was thermally oxidized to form thin silicon oxide film 31 (film thickness: 6 nm). Further, then, thick silicon nitride film 8 (film thickness: 100 nm) was formed on silicon oxide film 31, and then, silicon nitride film 8 and silicon oxide film 31 were patterned by using a usual photolithography technique and dry etching technique to form a mask pattern.

Then, silicon semiconductor substrate 1 was processed using this mask pattern as a mask to provide protrusion-like region 9 protruding upward from predetermined plane of silicon semiconductor substrate 1. Next, thermal oxidation was performed to form silicon oxide film 10 for protection (film thickness: 7 nm) on the exposed silicon surface of protrusion-like region 9 and the surface of P-type silicon semiconductor substrate 1 (FIG. 2).

Then, as shown in FIG. 3, silicon nitride film (film thickness: 7 nm) 11 was deposited and then etched back to form a spacer of silicon nitride film 11 on the side of protrusion-like region 9 on which silicon oxide film 10 was formed.

Then, thermal oxidation was performed in this state at a temperature of 1000° C. At this time, as shown in FIG. 4, an oxidizing species intruded from the lower portion of silicon nitride film 11 for a spacer, and the lower portion of protrusion-like region 9 and the portion of semiconductor substrate 1 except the part where the protrusion-like region was provided were thermally oxidized, so that bird's beak-like thick silicon oxide film (a first insulating film, film thickness: 30 nm) 6 was formed on these portions.

The thickness of this bird's beak can be controlled by adjusting the temperature of thermal oxidation according to the film thickness of silicon oxide film 10 and silicon nitride film spacer 11. In other words, when silicon oxide film 10 is thin, the bird's beak is not easily formed, and when silicon nitride film spacer 11 is thick, the bird's beak is not easily formed. For example, when the film thickness of silicon oxide film 10 is 5 nm to 10 nm, and the film thickness of silicon nitride film spacer 11 is 5 nm to 10 nm, the bird's beak can be controlled by controlling the temperature of thermal oxidation at 800 to 1000° C. This is because when the temperature of thermal oxidation is less than 800° C., long oxidation time may be required, and when the temperature of thermal oxidation is more than 1000° C., the bird's beak is easily formed, so that the control of the bird's beak is difficult.

Next, using the mask pattern as a mask, arsenic as an N-type impurity was implanted (voltage: 40 keV, and implantation amount: $2\times10^{13}/cm^2$) into the portion in P-type silicon semiconductor substrate 1 except the part where protrusion-like region 9 was formed, and then, heat treatment (1000° C. and 10 s) was performed to form N-type lower impurity diffusion region 2 in P-type silicon semiconductor substrate 1.

Next, silicon nitride film 11 and the above silicon oxide film 10 for protection were removed. Then, as shown in FIG. 5, the silicon side of protrusion-like region 9 that was exposed by removing silicon nitride film 11 and silicon oxide film 10 was thermally oxidized to form gate insulating film 5 (film thickness: 5 nm) on the side of protrusion-like region 9.

Further, a polycrystalline silicon film into which phosphorus was introduced at a concentration of $4\times10^{20}/cm^3$ was deposited on the entire surface, and then, etching back was performed to form gate electrode 7 on lower impurity diffusion region 2 and the side of protrusion-like region 9 (on oxide film 6 and gate insulating film 5) (FIG. 5).

Next, as shown in FIG. 6, interlayer insulating film 101 was deposited on the entire surface, and then planarized using a usual CMP technique. At this time, the above silicon nitride film 8 acted as a stopper in planarization.

Next, as shown in FIG. 7, silicon nitride film 8 was removed, and then, silicon nitride film 102 having a film thickness of 20 nm was deposited. Then, further, etching back was performed to form side spacer 102 on protrusion-like region 9. Then, arsenic was implanted into the upper portion of protrusion-like region 9 at 10 keV at $1\times10^{13}/cm^2$, and heat treatment (1000° C. and 10 s) was performed to make the upper portion of protrusion-like region 9 N-type upper impurity diffusion region 3. Also, at this time, the portion of protrusion-like region 9 except upper impurity diffusion region 3 was a channel region (FIG. 7). Lastly, embedded electrode 103 was formed in communication with upper impurity diffusion region 3 to manufacture the vertical MOS transistor shown in FIG. 1.

In this manner, in the present invention, by the film thickness of insulating film 6 being thick, the distance between lower impurity diffusion region 2 and gate electrode 7 in a vertical MOS transistor could become longer and the occurrence of junction leak current due to GIDL could be prevented. The vertical MOS transistor could be manufactured by simple steps. For example, when this vertical MOS transistor is used as the cell transistor of a DRAM, and an information holding portion is connected to lower impurity diffusion region 2, a low power DRAM that prevents the degradation of information holding properties due to GIDL can be provided.

Example 2

Example 2 will be described below in detail with reference to FIGS. 8 to 15. This example corresponds to the above method for manufacturing the second embodiment.

First, as in the above Example 1, protrusion-like region 9 was formed on P-type Si semiconductor substrate 1, and silicon oxide film 10 for protection and a spacer of silicon nitride film 11 were formed on the side of protrusion-like region 9 (steps (A) to (D) and FIG. 3). Next, by thermal oxidation, the film thickness of the oxide film on the portion of P-type Si semiconductor substrate 1 except protrusion-like region 9 was increased to form first insulating film (numeral 6) on this portion. This first insulating film (numeral 6) may be formed by a method such as Example 1 or may be formed by a CVD method controlling a deposition component and a sputtering component.

Next, using the mask pattern as a mask, arsenic as an N-type impurity was implanted (implantation voltage: 40 keV, and implantation amount: $2 \times 10^{13}/cm^2$) into the portion in P-type silicon semiconductor substrate 1 except the part where protrusion-like region 9 was formed, and then, heat treatment (1000° C. and 10 s) was performed to form N-type lower impurity diffusion region 2 in P-type silicon substrate 1 (FIG. 9). Next, silicon nitride film 11 and the above silicon oxide film 10 for protection were removed to expose the silicon side of protrusion-like region 9 (FIG. 10).

Next, as shown in FIG. 11, ISSG oxidation (thermal oxidation) in which the oxidation speed of silicon and silicon nitride was equal was performed to form silicon oxide film (second insulating film) 5 having a film thickness of 10 nm on the side of protrusion-like region 9 and the upper surface and side of mask pattern 8. For the conditions of ISSG oxidation, ISSG oxidation was carried out in a water vapor atmosphere containing 30 vol % of hydrogen at a temperature of 900° C. Also, at this time, a gate insulating film was formed on the side of the portion of protrusion-like region 9 except the upper portion.

Further, a polycrystalline silicon film into which phosphorus was introduced at a concentration of $4 \times 10^{20}/cm^3$ was deposited on the entire surface, and then, etching back was performed to form gate electrode 7 on lower impurity diffusion region 2 and the side of protrusion-like region 9 (on oxide film 6 and gate insulating film 5) (FIG. 12).

Next, as shown in FIG. 13, second insulating film 5 provided on the side of the upper portion of protrusion-like region 9 was removed by anisotropic dry etching to expose the upper portion side of gate electrode 7 opposed to the upper portion side of protrusion-like region 9 (FIG. 13). The etching amount of this insulating film 5 was adjusted so that insulating film 5 receded from the silicon upper portion of protrusion-like region 9 by 30 nm.

Next, the upper portion side of the protrusion-like region and the upper portion side of the gate electrode opposed to the upper portion side of the protrusion-like region were thermally oxidized in a dry oxygen atmosphere at 1000° C. to form third insulating film (numeral 12). At this time, thermal oxidation also proceeded laterally, so that the thickness of third insulating film (numeral 12) was 25 nm, which was thicker than the thickness of gate insulating film 5 (FIG. 14).

Then, as shown in FIG. 15, the mask pattern of silicon nitride film 8 was removed, and then, silicon nitride film 102 having a film thickness of 20 nm was newly deposited and etched back to form a spacer. Then, arsenic was implanted into the upper portion of protrusion-like region 9 at 10 keV at $1 \times 10^{13}/cm^2$, and heat treatment (1000° C. and 10 s) was performed to make the upper portion of protrusion-like region 9 upper impurity diffusion region 3. Also, at this time, the portion of protrusion-like region 9 except upper impurity diffusion region 3 was a channel region. Lastly, embedded electrode 103 was formed in communication with upper impurity diffusion region 3 to manufacture the vertical MOS transistor shown in FIG. 8.

In the present invention, in a vertical MOS transistor, the film thickness of first insulating film 6 and third insulating film 12 could become thicker than the film thickness of gate insulating film 5 in this manner and the distance between lower impurity diffusion region 2 and gate electrode 7 and between upper impurity diffusion region 3 and gate electrode 7 could become longer. The vertical MOS transistor could be stably manufactured by simple steps. In this vertical MOS transistor, the occurrence of junction leak current due to GIDL can be effectively prevented. For example, when the vertical MOS transistor of the present invention is used as the cell transistor of a DRAM, and an information holding portion is connected to upper impurity diffusion region 3, the degradation of information holding properties due to GIDL can be prevented to provide a low power DRAM.

Example 3

Example 3 will be described below in detail with reference to FIGS. 16 to 21. This example corresponds to the above method for manufacturing the third embodiment.

First, the steps up to FIG. 17 were carried out as in Example 2. The etching amount of second insulating film (numeral 5) was adjusted so that insulating film 5 receded from the silicon upper portion of protrusion-like region 9 by 30 nm.

Then, as shown in FIG. 18, thermal oxidation was performed in an oxidizing atmosphere containing water vapor at a temperature of 800° C. to form silicon oxide film 17 (forth insulating film) on the upper portion side of protrusion-like region 9 and form silicon oxide film 16 (forth insulating film) on the upper portion side of the gate electrode opposed to the upper portion side of protrusion-like region 9. At this time, a void was created between the upper portion side of protrusion-like region 9 and the upper portion side of gate electrode 7. Also, in this step, by lowering the temperature of thermal oxidation, the film thickness of silicon oxide film 17 was thin, and the film thickness of silicon oxide film 16 was thick. In this example, silicon oxide film 16 and silicon oxide film 17 were formed so that the film thickness of silicon oxide film 16 was 8 nm and the film thickness of silicon oxide film 17 was 2 nm.

Next, as shown in FIG. 19, first, 3 nm was etched with a HF solution to remove silicon oxide film 17. Then, further, the upper portion silicon side of protrusion-like region 9 was etched with a $HF/HNO_3$ solution to narrow and expose the upper portion of protrusion-like region 9. Here, 6 nm was etched on the side of protrusion-like region 9.

Then, as shown in FIG. 20, thermal oxidation was performed again in an oxidizing atmosphere containing water vapor at a temperature of 750° C. Then, fifth insulating films 13 and 14 were deposited so that the void remained as air gap region 15 between the upper portion side of protrusion-like region 9 and the upper portion side of gate electrode 7 opposed to the upper portion side of protrusion-like region 9.

At this time, the thickness of silicon oxide film 14 was 23 nm, and the thickness of silicon oxide film 13 was 4 nm. Also, the width of air gap region 15 was 4 nm. These insulating films 13 and 14 and air gap region 15 make up insulating region. Also, air gap region 15 is a region in which no solid material is present, and in air gap region 15, the degree of vacuum is high, or a gas of predetermined composition is present. Also, the width of this air gap region 15 is equivalent to about 15 nm of the thickness of the silicon oxide film, therefore, when an air gap region is formed, a thick film thickness as the silicon oxide film can be ensured even if the region is narrow.

Then, as shown in FIG. 21, the mask pattern of silicon nitride film 8 was removed, and then, silicon nitride film 102 having a film thickness of 20 nm was newly deposited and etched back to form a spacer. Then, arsenic was implanted into the upper portion of protrusion-like region 9 at 10 keV at $1 \times 10^{13}/cm^2$, and heat treatment (1000° C. and 10 s) was performed to make the upper portion of protrusion-like region 9 upper impurity diffusion region 3 (FIG. 22). Also, at this time, the portion of protrusion-like region 9 except upper impurity diffusion region 3 was a channel region. Lastly, embedded electrode 103 was formed in communication with upper impurity diffusion region 3 to manufacture the vertical MOS transistor shown in FIG. 23.

In the present invention, in a vertical MOS transistor, the effective film thickness of insulating films 13 and 14 and air gap region 15 and the film thickness of insulating film 6 could become thicker than the film thickness of gate insulating film 5 in this manner. The distance between lower impurity diffusion region 2 and gate electrode 7 and between upper impurity diffusion region 3 and gate electrode 7 could become longer. The vertical MOS transistor could be stably manufactured by simple steps. Also, this vertical MOS transistor can effectively prevent the occurrence of junction leak current due to GIDL. For example, when the vertical MOS transistor of the present invention is used as the cell transistor of a DRAM, and an information holding portion is connected to upper impurity diffusion region 3, the degradation of information holding properties due to GIDL can be prevented to provide a low power DRAM.

What is claimed is:

1. A method for manufacturing a vertical MOS transistor comprising:
    providing a mask pattern on a silicon semiconductor substrate;
    patterning the silicon semiconductor substrate using the mask pattern as a mask to provide a protrusion-like region protruding upward from a predetermined plane of the silicon semiconductor substrate;
    forming a silicon oxide film and a silicon nitride film in sequence on an exposed surface of the protrusion-like region and a surface of the silicon semiconductor substrate;
    increasing a film thickness of at least the silicon oxide film on the silicon semiconductor substrate by thermal oxidation to form a first insulating film;
    implanting an impurity into the silicon semiconductor substrate using the mask pattern as the mask and then thermally treating to form a lower impurity diffusion region;
    removing the silicon oxide film except the first insulating film and the silicon nitride film to expose a silicon side of the protrusion-like region;
    thermally oxidizing the exposed silicon side of the protrusion-like region to form a second insulating film having a thinner film thickness than a film thickness of the first insulating film;
    forming a gate electrode over a side of the protrusion-like region;
    removing the mask pattern; and
    implanting an impurity into an upper portion of the protrusion-like region and then thermally treating to form an upper impurity diffusion region.

2. The method for manufacturing a vertical MOS transistor according to claim 1, wherein
    in providing a mask pattern, the mask pattern comprising a $SiO_2$ film having a film thickness of 5 to 10 nm and a SiN film having a film thickness of 100 to 200 nm is provided,
    in forming a silicon oxide film and a silicon nitride film, the silicon oxide film having a film thickness of 5 to 10 nm and the silicon nitride film are formed, and
    in increasing a film thickness of at least the silicon oxide film on the silicon semiconductor substrate, the thermal oxidation is performed in a dry oxygen atmosphere at a temperature of 800 to 1000° C. to form the first insulating film having a film thickness of 30 to 50 nm.

3. The method for manufacturing a vertical MOS transistor according to claim 1, further comprising, between forming the gate electrode and removing the mask pattern,
    removing the second insulating film on an upper portion side of the protrusion-like region so that the second insulating film remains on a side of a portion of the protrusion-like region except an upper portion; and
    performing the thermal oxidation to form a third insulating film on the upper portion side of the protrusion-like region so that a film thickness of the third insulating film is thicker than a film thickness of the remaining second insulating film.

4. The method for manufacturing a vertical MOS transistor according to claim 3, wherein
    in forming a silicon oxide film and a silicon nitride film, the silicon oxide film having a film thickness of 5 to 10 nm and the silicon nitride film are formed, and
    in performing the thermal oxidation to form a third insulating film, the thermal oxidation is performed in a dry oxygen atmosphere or in a water vapor atmosphere at 800 to 1000° C. to form a $SiO_2$ film having a film thickness of 10 to 30 nm as the third insulating film.

5. The method for manufacturing a vertical MOS transistor according to claim 1, further comprising, between forming the gate electrode and removing the mask pattern,
    removing the second insulating film on an upper portion side of the protrusion-like region so that the second insulating film remains on a side of a portion of the protrusion-like region except an upper portion;
    thermally oxidizing the upper portion side of the protrusion-like region and an upper portion side of the gate electrode opposed to the upper portion side of the protrusion-like region to form a forth insulating film so that a void is created between the upper portion side of the protrusion-like region and the upper portion side of the gate electrode;
    etching the forth insulating film on the upper portion side of the protrusion-like region to expose the upper portion side of the protrusion-like region; and
    forming a fifth insulating film between the upper portion side of the protrusion-like region and the upper portion side of the gate electrode so that a void remains between the upper portion side of the protrusion-like region and the upper portion side of the gate electrode.

6. The method for manufacturing a vertical MOS transistor according to claim 5, wherein
    in forming a fifth insulating film, thermal oxidation is performed in an oxidizing atmosphere containing water vapor in a temperature range of 650 to 850° C. to form the fifth insulating film.

7. A method for manufacturing a vertical MOS transistor comprising:
    forming a protrusion-like region protruding upward from a predetermined plane of a silicon semiconductor substrate;
    forming a silicon oxide film on an exposed surface of the protrusion-like region and a surface of the silicon semiconductor substrate;
    increasing a film thickness of at least the silicon oxide film on the silicon semiconductor substrate by thermal oxidation to form a first insulating film;
    forming a lower impurity diffusion region extending from a lower portion of the protrusion-like region to an inside of the silicon semiconductor substrate;

removing the silicon oxide film except the first insulating film to expose a silicon side of the protrusion-like region;

thermally oxidizing the exposed silicon side of the protrusion-like region to form a second insulating film having a thinner film thickness than a film thickness of the first insulating film;

forming a gate electrode over a side of the protrusion-like region; and;

forming an upper impurity diffusion region in an upper portion of the protrusion-like region.

8. The method for manufacturing a vertical MOS transistor according to claim 7, wherein in increasing a film thickness of at least the silicon oxide film on the silicon semiconductor substrate, the thermal oxidation is performed in a dry oxygen atmosphere at a temperature of 800 to 1000° C. to form the first insulating film having a film thickness of 30 to 50 nm.

9. The method for manufacturing a vertical MOS transistor according to claim 7, further comprising, between forming the gate electrode and forming the upper impurity diffusion region, removing the second insulating film on an upper portion side of the protrusion-like region so that the second insulating film remains on a side of a portion of the protrusion-like region except an upper portion; and performing the thermal oxidation to form a third insulating film on the upper portion side of the protrusion-like region so that a film thickness of the third insulating film is thicker than a film thickness of the remaining second insulating film.

10. The method for manufacturing a vertical MOS transistor according to claim 9, wherein in performing the thermal oxidation to form a third insulating film, the thermal oxidation is performed in a dry oxygen atmosphere or in a water vapor atmosphere at 800 to 1000° C. to form a $SiO_2$ film having a film thickness of 10 to 30 nm as the third insulating film.

11. The method for manufacturing a vertical MOS transistor according to claim 7, further comprising, between forming the gate electrode and forming the upper impurity diffusion region, removing the second insulating film on an upper portion side of the protrusion-like region so that the second insulating film remains on a side of a portion of the protrusion-like region except an upper portion;

thermally oxidizing the upper portion side of the protrusion-like region and an upper portion side of the gate electrode opposed to the upper portion side of the protrusion-like region to form a forth insulating film so that a void is formed between the upper portion side of the protrusion-like region and the upper portion side of the gate electrode;

etching the forth insulating film on the upper portion side of the protrusion-like region to expose the upper portion side of the protrusion-like region; and forming a fifth insulating film between the upper portion side of the protrusion-like region and the upper portion side of the gate electrode so that a void remains between the upper portion side of the protrusion-like region and the upper portion side of the gate electrode.

12. The method for manufacturing a vertical MOS transistor according to claim 11, wherein in forming a fifth insulating film, thermal oxidation is performed in an oxidizing atmosphere containing water vapor in a temperature range of 650 to 850° C. to form the fifth insulating film.

13. A method for manufacturing a vertical MOS transistor comprising:

forming a protrusion-like region protruding upward from a predetermined plane of a silicon semiconductor substrate;

forming a silicon oxide film on an exposed surface of the protrusion-like region and a surface of the silicon semiconductor substrate;

increasing a film thickness of at least the silicon oxide film on the silicon semiconductor substrate by thermal oxidation to form a first insulating film;

forming a lower impurity diffusion region extending from a lower portion of the protrusion-like region to an inside of the silicon semiconductor substrate;

removing the silicon oxide film except the first insulating film to expose a silicon side of the protrusion-like region;

thermally oxidizing the exposed silicon side of the protrusion-like region to form a second insulating film having a thinner film thickness than a film thickness of the first insulating film;

forming a gate electrode over a side of the protrusion-like region;

removing the second insulating film on an upper portion side of the protrusion-like region so that the second insulating film remains on a side of a portion of the protrusion-like region except an upper portion;

forming a third insulating film having a thicker film thickness than a film thickness of the second insulating film or an insulating region having a thicker effective film thickness than a film thickness of the second insulating film between the upper portion side of the protrusion-like region and an upper portion side of the gate electrode opposed to the upper portion side of the protrusion-like region; and forming an upper impurity diffusion region in an upper portion of the protrusion-like region.

14. The method for manufacturing a vertical MOS transistor according to claim 13, wherein in forming a third insulating film or an insulating region, the upper portion side of the protrusion-like region and the upper portion side of the gate electrode are thermally oxidized to form the third insulating film so that a film thickness of the third insulating film is thicker than a film thickness of the remaining second insulating film.

15. The method for manufacturing a vertical MOS transistor according to claim 13, wherein in forming a third insulating film or an insulating region, the upper portion side of the protrusion-like region and the upper portion side of the gate electrode are thermally oxidized to form a forth insulating film so that a void is formed between the upper portion side of the protrusion-like region and the upper portion side of the gate electrode, the forth insulating film on the upper portion side of the protrusion-like region is etched to expose the upper portion side of the protrusion-like region, and a fifth insulating film is formed between the upper portion side of the protrusion-like region and the upper portion side of the gate electrode so that a void remains between the upper portion side of the protrusion-like region and the upper portion side of the gate electrode.

* * * * *